US008237687B2

(12) United States Patent
Koyama

(10) Patent No.: US 8,237,687 B2
(45) Date of Patent: Aug. 7, 2012

(54) DISPLAY DEVICE AND METHOD FOR DRIVING USING VARIABLE FREQUENCY ACCORDING TO GRAY SCALE DISPLAY MODE

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 905 days.

(21) Appl. No.: 11/276,212

(22) Filed: Feb. 17, 2006

(65) Prior Publication Data

US 2006/0238458 A1     Oct. 26, 2006

Related U.S. Application Data

(63) Continuation of application No. 10/118,917, filed on Apr. 10, 2002, now Pat. No. 7,027,074.

(30) Foreign Application Priority Data

Apr. 20, 2001    (JP) ................................ 2001-121883

(51) Int. Cl.
    *G06F 3/038*     (2006.01)
    *G09G 5/00*     (2006.01)
(52) U.S. Cl. ........... 345/204; 345/77; 345/213; 345/690
(58) Field of Classification Search ........... 345/1.1–111, 345/204–215, 690–699
See application file for complete search history.

(56) References Cited

U.S. PATENT DOCUMENTS

| 5,390,293 A | 2/1995 | Nishioka et al. |
| 5,600,344 A | 2/1997 | Sono et al. |
| 5,818,419 A | 10/1998 | Tajima |
| 5,844,549 A * | 12/1998 | Sonoda ........................ 345/537 |
| 5,991,883 A | 11/1999 | Atkinson |
| 6,037,917 A | 3/2000 | Kawakami |
| 6,040,812 A | 3/2000 | Lewis |
| 6,088,012 A | 7/2000 | Shigeta |
| 6,115,017 A | 9/2000 | Mikami et al. |
| 6,229,505 B1 | 5/2001 | Fujii |

(Continued)

FOREIGN PATENT DOCUMENTS

CN     1 290 041     4/2001

(Continued)

OTHER PUBLICATIONS

U.S. Appl. No. 09/833,673, filed Apr. 13, 2001, Yamazaki.

(Continued)

*Primary Examiner* — Lun-Yi Lao
*Assistant Examiner* — Gene W Lee
(74) *Attorney, Agent, or Firm* — Fish & Richardson P.C.

(57) ABSTRACT

Write in of lower significant bits of a digital video signal to a memory is eliminated by a memory controller of a signal control circuit in a display device during a second display mode in which the number of gray scales is reduced, as compared to a first display mode. Further, read out of the lower significant bits of the digital video signal from the memory is also eliminated. The amount of information of digital image signals input to a source signal line driver circuit is reduced. Corresponding to this operation, a display controller functions to make start pulses and clock pulses input to each driver circuit have a lower frequency, and write in periods and display periods of sub-frame periods participating in display are set longer.

18 Claims, 16 Drawing Sheets

U.S. PATENT DOCUMENTS

| | | | |
|---|---|---|---|
| 6,329,973 B1 | 12/2001 | Akimoto et al. | |
| 6,337,677 B1 | 1/2002 | Higashi | |
| 6,339,422 B1 | 1/2002 | Kuwajima | |
| 6,346,972 B1 * | 2/2002 | Kim | 348/569 |
| 6,356,028 B1 | 3/2002 | Legagneux et al. | |
| 6,396,508 B1 | 5/2002 | Noecker | |
| 6,417,824 B1 | 7/2002 | Tokunaga | |
| 6,479,940 B1 | 11/2002 | Ishizuka | |
| 6,501,227 B1 | 12/2002 | Koyama | |
| 6,552,736 B2 | 4/2003 | Honda | |
| 6,617,785 B2 | 9/2003 | Shibata et al. | |
| 6,646,625 B1 | 11/2003 | Shigeta | |
| 6,678,834 B1 | 1/2004 | Aihara | |
| 6,693,385 B2 | 2/2004 | Koyama | |
| 6,693,614 B2 | 2/2004 | Kamiya | |
| 6,700,330 B2 | 3/2004 | Koyama | |
| 6,738,036 B2 | 5/2004 | Janssen | |
| 6,806,859 B1 | 10/2004 | Kanoh | |
| 6,867,761 B2 | 3/2005 | Matsueda | |
| 7,030,846 B2 * | 4/2006 | Lee et al. | 345/89 |
| 2001/0005196 A1 | 6/2001 | Ishii | |
| 2001/0011989 A1 | 8/2001 | Hayashi | |
| 2002/0000969 A1 | 1/2002 | Ozawa | |
| 2002/0011972 A1 * | 1/2002 | Yamazaki et al. | 345/74.1 |
| 2002/0036610 A1 | 3/2002 | Ito et al. | |
| 2002/0047568 A1 | 4/2002 | Koyama | |
| 2002/0047852 A1 | 4/2002 | Inukai | |
| 2002/0154079 A1 * | 10/2002 | Shiota et al. | 345/87 |
| 2002/0154151 A1 | 10/2002 | Koyama | |
| 2003/0063077 A1 | 4/2003 | Koyama | |
| 2003/0117083 A1 | 6/2003 | Koyama | |
| 2003/0174153 A1 | 9/2003 | Koyama | |
| 2004/0095364 A1 | 5/2004 | Koyama | |

FOREIGN PATENT DOCUMENTS

| | | |
|---|---|---|
| EP | 0 851 400 | 7/1998 |
| EP | 1 087 366 | 3/2001 |
| EP | 1 103 946 | 5/2001 |
| EP | 1 184 833 | 3/2002 |
| GB | 2 177 829 | 1/1987 |
| JP | 06-259034 | 9/1994 |
| JP | 07-072825 | 3/1995 |
| JP | 08-069690 | 3/1996 |
| JP | 10-232649 | 9/1998 |
| JP | 11-133921 | 5/1999 |
| JP | 11-352929 | 12/1999 |
| JP | 2000-066638 | 3/2000 |
| JP | 2000-276106 | 10/2000 |
| JP | 2001-092412 | 4/2001 |
| JP | 2001-343933 | 12/2001 |
| JP | 2002-082644 | 3/2002 |
| JP | 2002-108285 | 4/2002 |
| JP | 2002-149113 | 5/2002 |
| JP | 2002-149119 | 5/2002 |
| TW | 78107405 | 1/1991 |
| WO | 2000/000958 A1 | 1/2000 |

OTHER PUBLICATIONS

Hajime Washio et al.; "TFT-LCDs with Monolithic Multi-Drivers for High Performance Video and Low-Power Text Modes"; *SID 01 Digest*; pp. 276-279; 2001.

European Search Report (Application No. 02008576.7), dated Apr. 12, 2007, 3 pages.

Search Report, European Application No. 10009813.6, dated Aug. 29, 2011, 13 pages, in English.

* cited by examiner

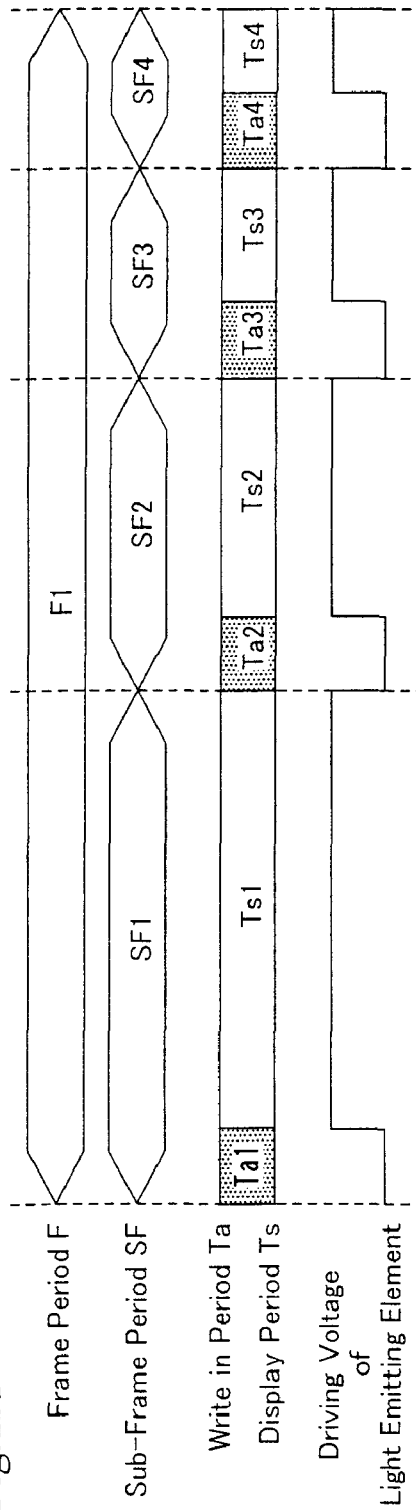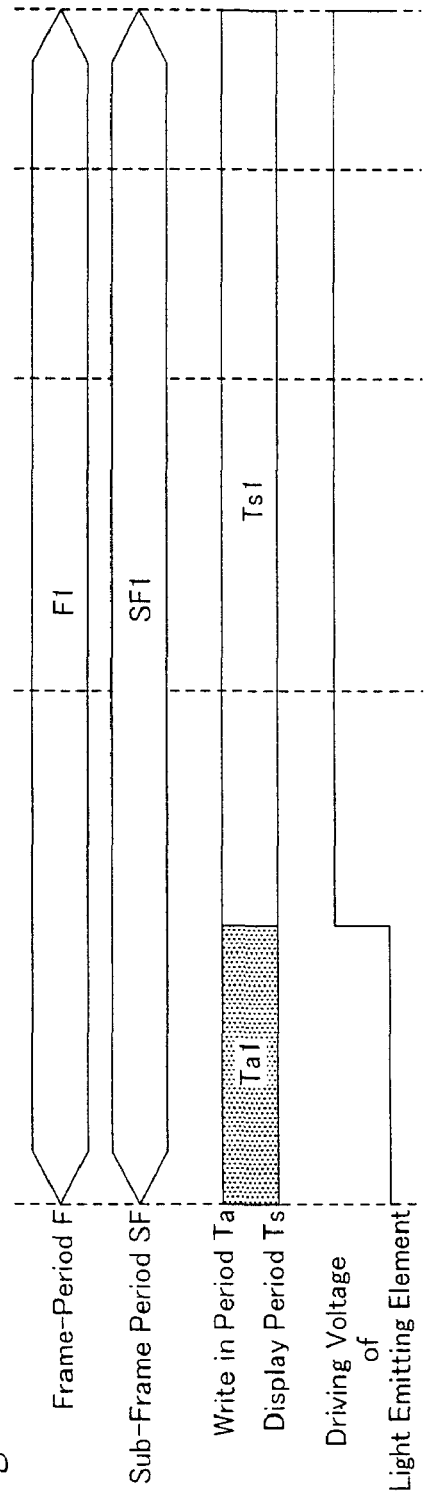

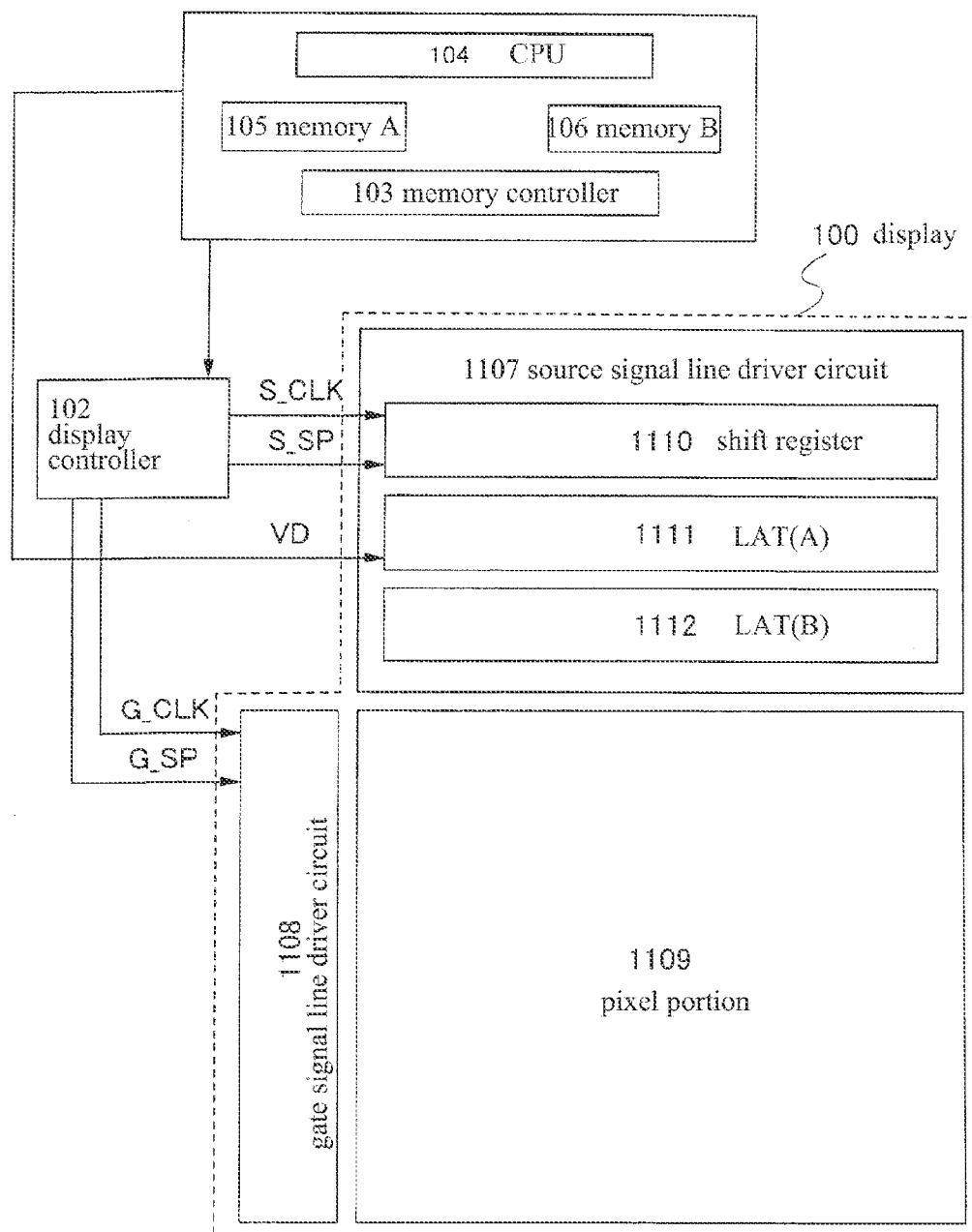

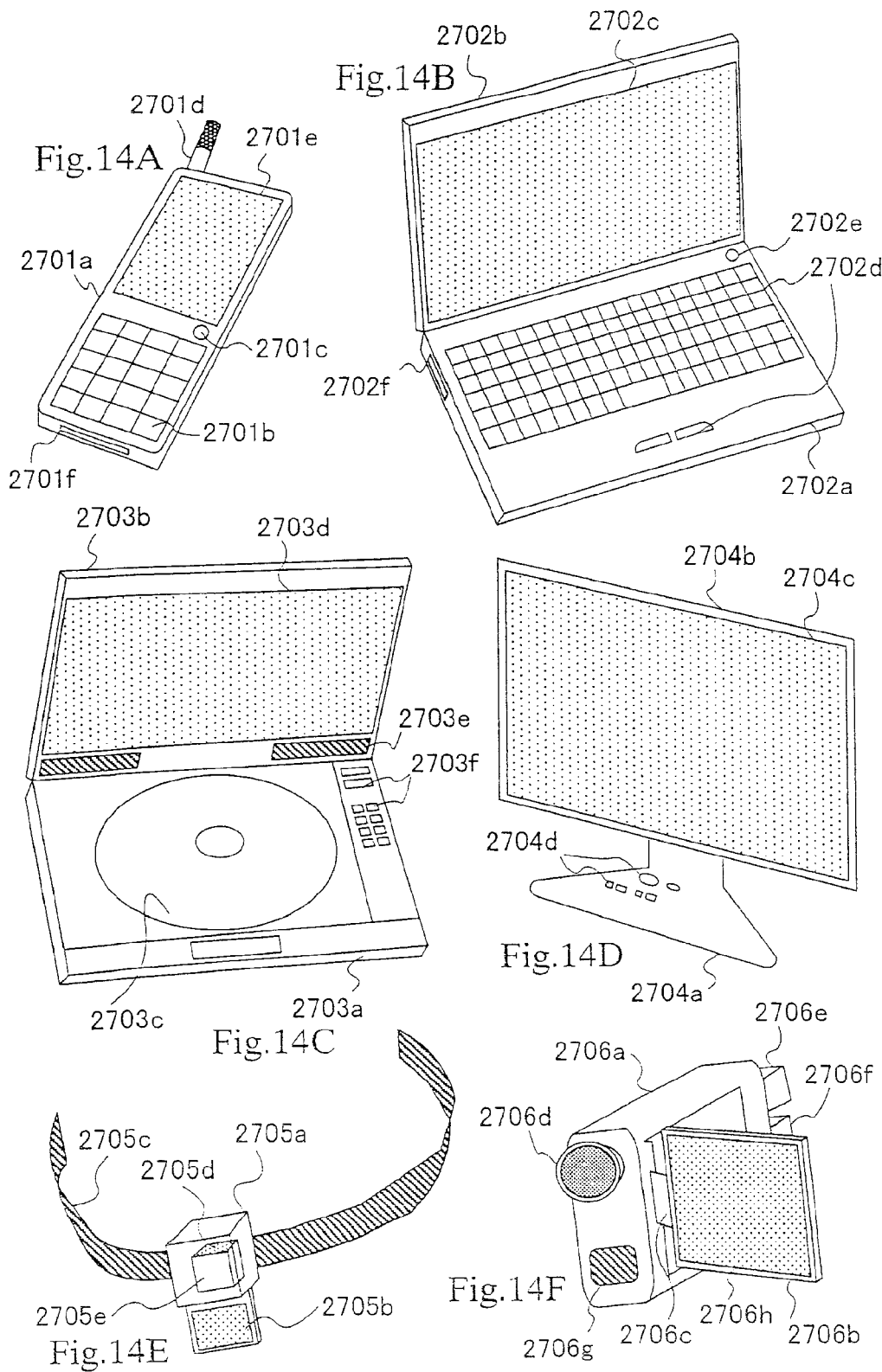

DISPLAY DEVICE AND METHOD FOR DRIVING USING VARIABLE FREQUENCY ACCORDING TO GRAY SCALE DISPLAY MODE

BACKGROUND OF THE INVENTION

1. Field of the Invention

The present invention relates to a display device for displaying an image by inputting a digital video signal. In particular, the present invention relates to a display device having light emitting elements. Further, the present invention relates to electronic equipment that uses the display device.

2. Description of the Related Art

A display device having a light emitting element disposed in each pixel which performs display of an image by controlling light emitted from the light emitting elements is explained below.

The explanation throughout this specification uses elements (OLED elements) having a structure in which an organic compound layer for emitting light when an electric field is generated is sandwiched between an anode and a cathode, for the light emitting elements, but the present invention is not limited to this structure.

Further, the explanation within this specification uses elements that utilize light emitted when making a transition from singlet excitons to a base state (fluorescence), and those that utilize light emitted when making a transition from triplet excitons to a base state (phosphorescence).

Layers such as hole injecting layers, hole transporting layers, light emitting layers, electron transporting layers, electron injecting layers can be given as organic compound layers. Light emitting elements basically are shown by structures in which an anode, a light emitting layer, and a cathode overlap in this order. In addition, structures such as a structure in which an anode, a hole injecting layer, a light emitting layer, an electron injecting layer, and a cathode are overlapped in this order, and one in which an anode, a hole injecting layer, a hole transporting layer, a light emitting layer, an electron transporting layer, an electron injecting layer, and a cathode are overlapped in this order may also be used.

Note that the organic compound layers are not limited to laminate structures in which layers such as hole injecting layers, hole transporting layers, light emitting layers, electron transporting layers, and electron injecting layers are clearly separated from each other. That is, the organic compound layers may also have a structure having a layer in which the materials used for structuring hole injecting layers, hole transporting layers, light emitting layers, electron transporting layers, and electron injecting layers are mixed.

Further, any types of materials of low molecular weight materials, high molecular weight materials, and intermediate molecular weight materials may be used as the OLED element organic compound layers.

Note that, in this specification, the term intermediate molecular weight material indicates materials having a molecularity equal to or less than 20, or those in which the length of the chained molecules is equal to or less than 10 µm and which do not have sublimation property.

A display devices is structured by a display and peripheral circuits for inputting signals to the display.

The structure of the display is explained below.

The display is structured by a source signal line driver circuit, a gate signal line driver circuit, and a pixel portion. The pixel portion has pixels disposed in a matrix shape.

Thin film transistors (hereafter referred to as TFTs) are arranged in each pixel of the pixel portion. A method of placing two TFTs in each pixel and controlling light emitted from the light emitting element of each pixel is explained.

FIG. 7 shows a structure of a pixel portion of a display device.

Source signal lines S1 to Sx, gate signal lines G1 to Gy, and electric power source supply lines V1 to Vx are arranged in a pixel portion 700, and x columns and y rows (where x and y are natural numbers) of pixels are also placed in the pixel portion. Each pixel 800 has a switching TFT 801, a driver TFT 802, a storage capacitor 803, and a light emitting element 804.

An enlarged view of one pixel of the pixel portion of FIG. 7 is shown in FIG. 8.

The pixel structure comprises one source signal line S of the source signal lines S1 to Sx, one gate signal line G of the gate signal lines G1 to Gy, one electric power source supply line V of the electric power source supply lines V1 to Vx, the switching TFT 801, the driver TFT 802, the storage capacitor 803, and the light emitting element 804.

A gate electrode of the switching TFT 801 is connected to the gate signal line G, and one of a source region and a drain region of the switching TFT 801 is connected to the source signal line S, while the other one is connected to a gate electrode of the driver TFT 802 or to one electrode of the storage capacitor 803. One of a source region and a drain region of the driver TFT 802 is connected to the electric power source supply line V, while the other one is connected to an anode or a cathode of the light emitting element 804. The electric power source supply line V is connected to one of the two electrodes of the storage capacitor 803, namely the electrode on the side to which the driver TFT 802 and the switching TFT 801 are not connected.

The anode of the light emitting element 804 is referred to as a pixel electrode, and the cathode of the light emitting element 804 is referred to as an opposing electrode, within this specification for cases in which the source region or the drain region of the driver TFT 802 is connected to the anode of the light emitting element 804. On the other hand, if the source region or the drain region of the driver TFT 802 is connected to the cathode of the light emitting element 804, then the cathode of the light emitting element 804 is referred to as the pixel electrode, and the anode of the light emitting element 804 is referred to as the opposing electrode.

Further, an electric potential imparted to the electric power source supply line V is referred to as an electric power source electric potential, and an electric potential imparted to the opposing electrode is referred to as an opposing electric potential.

The switching TFT 801 and the driver TFT 802 may be either p-channel TFTs or n-channel TFTs. However, it is preferable that the driver TFT 802 be a p-channel TFT, and that the switching TFT 801 be an n-channel TFT for cases in which the pixel electrode of the light emitting element 804 is the anode. Conversely, it is preferable that the driver TFT 802 be an n-channel TFT, and that the switching TFT 801 be a p-channel TFT if the pixel electrode is the cathode.

Note that the storage capacitor 803 need not always be formed.

For example, a parasitic capacitance generally referred to as a gate capacitance is formed in overlapping regions for cases where there is an LDD region in which the n-channel TFT used as the driver TFT 802 is formed so as to overlap with a gate electrode through a gate insulating film. It is possible to actively use this parasitic capacitance as a storage capacitor for storing a voltage applied to the gate electrode of the driver TFT 802.

Operation during display of an image with the aforementioned pixel structure is explained below.

A signal is input to the gate signal line G, and the electric potential of the gate electrode of the switching TFT 801 changes, thereby changing a gate voltage. The signal is input to the gate electrode of the driver TFT 802 by the source signal line S, via the source and drain of the switching TFT 801 which thus has been placed in a conductive state. Further, the signal is stored in the storage capacitor 803. The gate voltage of the driver TFT 802 changes in accordance with the signal input to the gate electrode of the driver TFT 802, thereby placing the source and drain in a conductive state. The electric potential of the electric power source supply line V is imparted to the pixel electrode of the light emitting element 804 through the driver TFT 802. The light emitting element 804 thus emits light.

A method of expressing gray scales with pixels having such a structure is explained.

Gray scale expression methods can be roughly divided into analog methods and digital methods. Digital methods have advantages compared to analog methods, such as being geared to multiple gray scales.

A digital gray scale expression method is focused upon here.

A time gray scale method can be given as the digital gray scale expression method.

A time gray scale driving method is explained in detail below.

The time gray scale driving method is a method of expressing gray scales by controlling the period that each pixel of a display device emits light.

If a period for displaying one image is taken as one frame period, then one frame period is divided into a plurality of subframe periods.

Turn on and turn off, namely whether or not the light emitting element of each pixel is made to emit light or to not emit light, is performed for each subframe period. The period during which the light emitting element emits light in one frame period is controlled, and a gray scale for each pixel is expressed.

The time gray scale driving method is explained in detail using timing charts of FIGS. 5A and 5B.

Note that an example of expressing gray scales using a 4-bit digital image signal is shown in FIG. 5A.

Note also that FIG. 7 and FIG. 8 may be referred to regarding the structure of the pixel portion and the structure of the pixels, respectively.

In accordance with an external electric power source (not shown in the figures), the opposing electric potential can be switched over between an electric potential on the same order as the electric potential of the electric power source supply lines V1 to Vx (electric power source electric potential), and an electric potential of the electric power source supply lines V1 to Vx on an order sufficient to make the light emitting element 804 emit light.

One frame period F is divided into a plurality of subframe periods SF1 to SF4.

The gate signal line G1 is selected first in the first subframe period SF1, and a digital image signal is input from the source signal lines S1 to Sx to each of the pixels having the switching TFTs 801 with gate electrodes connected to the gate signal line G1. The driver TFT 802 of each pixel is placed in an on state or an off state by the input digital image signal.

The term "on state" for a TFT in this specification indicates that the TFT is in a state in which there is conduction between the source and the drain in accordance with a gate voltage. Further, the term "off state" for a TFT indicates that there is a non-conductive state between the source and the drain in accordance with the gate voltage.

The opposing electric potential of the light emitting elements 804 is set nearly equal to the electric potential of the electric power source supply lines V1 to Vx (electric power source electric potential) at this point, and therefore the light emitting elements 804 do not emit light even in pixels having their driver TFT 802 in an on state.

FIG. 5B is a timing chart showing operation when the digital image signal is input to the driver TFT 802 of each pixel.

A sampling period in which a source signal line driver circuit (not shown in the figures) samples signals corresponding to each of the source signal lines are shown by reference symbols S1 to Sx in FIG. 5B. The sampled signals are output at the same time to all of the source signal lines in a return period in the figure. The signals thus output are thus input to the gate electrodes of the driver TFTs 802 in the pixels which have selected gate signal lines.

The aforementioned operations are repeated for all of the gate signal lines G1 to Gy, and a write in period Ta1 is completed.

Note that a period for write-in during the first subframe period SF1 is called Ta1. In general, a write in period of a j-th sub-frame period SFj (where j is a natural number) is called Taj.

The opposing electric potential changes when the write in period Ta1 is complete, so as to have an electric potential difference from the electric power source electric potential on an order so that the light emitting element 804 will emit light. A display period Ts1 thus begins.

Note that the display period of the first subframe period SF1 is called Ts1. In general, a display period of the j-th sub-frame period SFj (where j is a natural number) is denoted by using a reference symbol Tsj.

The light emitting elements 804 of each pixel are placed in a light emitting state or a non-light emitting state, corresponding to the input signal, in the display period Ts1.

As shown in FIG. 5A, the above operations are repeated for all of the subframe periods SF1 to SF4, thereby completing one frame period F1.

The length of the display periods Ts1 to Ts4 of the subframe periods SF1 to SF4 are set appropriately here, and gray scales are expressed by an accumulation of the display periods of the subframe period during which the light emitting elements 804 emit light. In other words, the total amount of the turn on time within one frame period is used to express the gray scales.

A method of generally expressing $2^n$ gray scales by inputting an n-bit digital video signal, is explained.

One frame period is divided into n sub-frame periods SF1 to SFn at this point, for example, and the ratios of the lengths of the display periods Ts1 to Tsn of the sub-frame periods SF1 to SFn are set so as to be Ts1::Ts2:: . . . ::Tsn−1::Tsn= $2^0::2^{-1}:: \ldots ::2^{-n+2}::2^{-n+1}$. Note that the lengths of the write in periods Ta1 to Tan are all the same.

Within one frame period, the gray scale of the pixels in the frame period is determined by finding the total of the display period Ts during which a light emitting state is selected in the light emitting elements 804. For example, if the brightness for a case in which a pixel emits light during all of the display periods is taken to be 100% when n=8, then a brightness of 1% can be expressed if the pixel emits light in the display period Ts8 and in the display period Ts7. A 60% brightness can be expressed for cases in which the pixel emits light in the display periods Ts6, Ts4, and Ts1.

A circuit for inputting a signal in order to perform the above-stated time gray scale driving method to the source signal line driver circuit and the gate signal line driver circuit of the display is explained using FIG. 10.

Signals input to the display device are referred to as digital video signals within this specification. Note that the example explained here is that of a display device into which an n-bit digital video signal is input.

The display device is structured by: a display 1100 composed of a source signal line driver circuit 1107, a gate signal line driver circuit 1108, and a pixel portion 1109; a signal control circuit 1101; and a display controller 1102.

The digital video signal is read in by the signal control circuit 1101, and the signal control circuit 1101 outputs a digital image signal (VD) to the display 1100.

A signal converted for input to the display 1100 in the signal control circuit, the edited digital video signal, is referred to as the digital image signal within this specification.

Signals for driving the source signal line driver circuit 1107 and the gate signal line driver circuit 1108 of the display 1100 are input from the display controller 1102.

The structure of the signal control circuit 1101 and the structure of the display controller 1102 are explained.

Note that the source signal line driver circuit 1107 of the display 1100 is structured by a shift register 1110, an LAT (A) 1111, and an LAT (B) 1112. In addition, although not shown in the figures, circuits such as level shifters and buffers may also be formed.

The signal control circuit 1101 is structured by a CPU 1104, a memory A 1105, a memory B 1106, and a memory controller 1103.

The digital video signal input to the signal control circuit 1101 is input to the memory A 1105 through the CPU 1104.

In other words, the digital signal for each bit, corresponding to each pixel, in the digital video signal is input to the memory A 1105 and stored.

The memory A 1105 has a capacity that is capable of storing the n-bit digital signal for all pixels of the pixel portion 1109 of the display 1100.

When one frame period portion of the digital signal is stored in the memory A 1105, the digital signal for each bit is read out in order by the memory controller 1103, and then input to the source signal line driver circuit as the digital image signal VD.

The digital video signal corresponding to the next frame period is then input to the memory B 1106, through the CPU 1104, when read out of the digital signals stored in the memory A 1105 begins, and storage of the digital video signal in the memory B begins. Similarly to the memory A 1105, the memory B 1106 also has a capacity that is capable of storing the n-bit digital signal for all pixels of the pixel portion of the display device.

The signal control circuit 1101 thus has the memory A 1105 and the memory B 1106, each of which is capable of storing one frame period portion of the n-bit digital signal. The digital video signal is sampled using the memory A 1105 and the memory B 1106 alternately.

The signal control circuit 1101 for storing signals by using the two memories alternately, namely the memory A 1105 and the memory B 1106, is shown here. In general, however, memories capable of storing information corresponding to a plurality of frame portions are used. These memories can be used alternately.

The structure of the memory controller 1103, used for controlling input of the digital video signal to, and read out of the signals from, the memory A 1105 and the memory B 1106 of the signal control circuit 1101, is explained using FIG. 11.

In FIG. 11, the memory controller 1103 is structured by a memory read/write control (hereafter referred to as memory R/W) circuit 1202, a standard oscillator circuit 1203, a variable frequency divider circuit 1204, an x-counter 1205a, a y-counter 1205b, an x-decoder 1206a, and a y-decoder 1206b.

Both memories, namely the memory A and the memory B, of the aforementioned signal control circuit are hereafter taken together and denoted as memory. Further, the memory is structured by a plurality of memory elements, and the memory elements are selected by using (x,y) addresses.

Signals from the CPU 1104 are input to the standard oscillator circuit 1203. Signals from the standard oscillator circuit 1203 are input to the variable frequency divider circuit 1204 and converted to signals having an appropriate frequency. The signals from the variable frequency divider circuit 1204 select x addresses of the memory through the x-counter 1205a and the decoder 1206a. At the same time, the signals from the variable frequency divider circuit 1204 select v addresses of the memory through the y-counter 1205b and the y-decoder 1206b. In this way, the addresses of the memory (x, y) are selected. Furthermore, signals from the CPU 1104 are input to the memory R/W circuit 1202, and a memory R/W signal for selecting write in operation of the signal to the memory, or read out operation of the signal from the memory, is output.

Memory addresses for writing in, or reading out, the digital signals are thus selected by the memory x address and the memory y address. Operations for write of the digital signal to, or read out of the digital signal from, the memory element selected by this address are performed in accordance with the memory R/W signal.

Next, the structure of the display controller 1102 in FIG. 10 is explained below.

The display controller 1102 outputs signals such as start pulses (S_SP, G_SP) and clock pulses (S_CLK, G_CLK) to the source signal line driver circuit 1107 and to the gate signal line driver circuit 1108.

The structure of the display controller 1102 is explained using FIG. 12.

The display controller 1102 is structured by a standard clock generator circuit 1301, a horizontal clock generator circuit 1303, a vertical clock generator circuit 1304, and an electric power source control circuit 1305 used for the light emitting elements.

A clock signal 31 input from the CPU 1104 is input to the standard clock generator circuit 1301, and a standard clock is generated. The standard clock is input to the horizontal clock generator circuit 1303 and to the vertical clock generator circuit 1304. Further, a horizontal period signal 32 for determining a horizontal period is input from the CPU 1104 to the horizontal clock generator circuit 1303, and the clock pulse S_CLK and the start pulse S_SP used for the source signal line driver circuit are output. At the same time, a vertical period signal 33 for determining a vertical period is input from the CPU 1104 to the vertical clock generator circuit 1304, and the clock pulse G_CLK and the start pulse G_SP used for the gate signal line driver circuit are output.

FIG. 10 will be referred to again.

The start pulse S_SP and the clock pulse S_CLK output from the display controller 1102 and used for the source signal line driver circuit are input to the shift register 1110 of the source signal line driver circuit 1107 in the display 1100. Further, the start pulse G_SP and the clock pulse G_CLK used for the gate signal line driver circuit are input to the gate signal line driver circuit 1108 of the display 1100.

In the display controller 1102, the electric power source controller circuit 1305 used for the light emitting element maintains the electric potential of the opposing electrode of the light emitting element of each pixel in the display at the same electric potential as the electric power source electric potential during the write in period. Further, the electric power source controller circuit 1305 controls the electric potential of the opposing electrode so that it changes to have an electric potential difference, with respect to the electric power source electric potential, on an order such that the light emitting element emits light.

The display device thus displays an image.

It is preferable that the display device have as little electric power consumption as possible here. Low electric power consumption is especially desirable if the display device is incorporated into a portable information device or the like to be utilized.

A method of suppressing the electric power consumption of the display device by reducing the number of gray scales during image display (the number of gray scales expressed) in the case in which a multiple gray scale display is not required, is proposed.

This method is explained in detail below using a timing chart of FIG. 9.

A display device, into which a 4-bit signal is input to thereby display $2^4$ gray scales, is noticed. Gray scales are expressed by using only the most significant 1-bit signal (digital signal) in accordance with a switching signal. A method of reducing the electric power consumption of the display device is explained here in an example.

A case of inputting a 4-bit digital video signal and expressing $2^4$ gray scales is referred to as a first display mode, and a case of expressing two gray scales by using only the most significant 1-bit signal is referred to as a second display mode.

Note that, in general, in the case of using an n-bit signal as the input digital video signal, the expression of gray scales using the n-bit signal is referred to as the first display mode. The expression of gray scales using only m bits of the signal (where m is a natural number less than n) from among the n bits is referred to as the second display mode.

Note that the first bit of the n-bit digital image signal is taken as the most significant bit, and that the n-bit is taken as the least significant bit.

In the second display mode, gray scales are expressed without using the signal corresponding to the lower bits of the digital image signal in the first display mode.

One frame period is divided into four sub-frame periods SF1 to SF4. The sub-frame periods SF1 to SF4 express in order the sub-frame period corresponding to the most significant bit to the sub-frame period corresponding to the least significant bit, and appear in this order to structure one frame period.

In the first display mode, the gray scales are expressed using all of the input 4-bit digital video signal, and therefore the signal input from the signal controller circuit to the source signal line driver circuit is the same as the case of expressing gray scales using the 4-bit digital image signal. Further, the clock pulse S_CLK and the start pulse S_SP for the source signal line driver circuit and the clock pulse G_CLK and the start pulse G_SP for the gate signal line driver circuit which are output from the display controller, are also the same as those used in the case of expressing gray scales using the 4-bit digital image signal.

A method of driving the display device in the second display mode is explained below.

A timing chart showing the method of driving the display device in the second display mode is shown in FIG. 9.

Signals are input to respective pixels in the first sub-frame period SF1. When the signals are input to all of the pixels, the opposing electric potential changes to have an electric potential difference from the electric power source electric potential so that the light emitting elements emit light. The light emitting elements of all of the pixels are thus placed in a light emitting state or a non-light emitting state.

Operations in the first sub-frame period are the same as the operations performed in the first display mode.

Next, the digital image signal is also similarly written to all of the pixels in the write in period of the second sub-frame period. However, in the following display period, the electric potential of the opposing electrode does not change so as to have an electric potential difference from the electric power source electric potential so that the light emitting element emit light. That is, the light emitting elements of the pixels do not emit light in the display period of the second sub-frame period, regardless of the signals input to the pixels. This period is denoted as non-display.

Operations in the second sub-frame period are similarly repeated in the third sub-frame period and in the fourth sub-frame period to thus complete one frame period.

The period in which the pixels perform display during one frame period is only the first sub-frame period. The number of times that the light emitting elements of the pixels emit light can thus be lowered in the second display mode, and the electric power consumption of the display device can be reduced.

In a conventional display device, each pixel of the display device does not perform display in a period except a sub-frame period which is corresponding to an upper bit in switching to a second display mode for expressing gray scales without using information of lower bits. However, in each driver circuit (source signal line driver circuit and gate signal line driver circuit), write in operation of the digital video signal to each pixel is performed. At this time, start pulses, clock pulses and the like are input to each driver circuit of the display device to thereby continue the operation.

Therefore, even in the second display mode in which gray scale display is performed with a small amount of information, each of the driver circuits repeatedly performs sampling of the digital image signal, which is the same as sampling operations in the first display mode. Electric power is therefore consumed for sampling, and there is a problem that the electric power consumption cannot be made smaller.

Furthermore, in the sub-frame periods except the sub-frame period during which display is actually performed, the pixels are all uniformly in a non-display state during which light is not emitted. There is therefore a problem that the proportion of the effective display period in one frame period is small.

SUMMARY OF THE INVENTION

An object of the present invention is to provide a display device in which electric power consumption is small and in which the proportion that an effective display period occupies per one frame period is large, in the case of performing drive in which the number of gray scales expressed is reduced. In addition, an object of the present invention is to provide a method of driving the display device.

Write in of the lower significant bits of a digital video signal to a memory is eliminated by a memory controller of a signal control circuit in a display device during a second display mode as compared to a first display mode. Further, read out of the lower significant bits of the digital signal from the memory is also eliminated. Each driver circuit thus inputs a digital image signal with a reduced amount of information (a second digital image signal) to a source signal line driver circuit in comparison to a digital image signal in the first display mode (a first digital image signal). Corresponding to this operation, a display controller functions to produce start pulses and clock pulses each with a lower frequency which are input to each of the driver circuits (the source signal line driver circuit and a gate signal line driver circuit). Write in periods and display periods of the sub-frame periods participating in display can thus be set longer.

A display device in which the electric power consumption is small and in which the proportion that an effective display period occupies per one frame period is large, can thus be provided in accordance with the above structure, as well as a method of driving the display device.

Structures of the present invention are discussed below.

In accordance with the present invention, a display device is provided, in which:
one frame period is divided into a plurality of sub-frame periods:
turn on or turn off is performed in the sub-frame periods, and gray scales are expressed by the total amount of turn on time within the one frame period:
there is a first display mode in which one frame period is divided into n sub-frame periods (where n is a natural number), and a second display mode in which one frame period is divided into m sub-frame periods (where m is a natural number less than n).

In accordance with the present invention, a display device is provided, and the display device has:
a display; and
a display controller for supplying a clock signal,
wherein one frame period is divided into a plurality of sub-frame periods,
wherein turn on or turn off is performed in the sub-frame periods, and gray scales are expressed by the total amount of turn on time within the one frame period and
wherein the display controller supplies clock signals with different frequencies to the display in accordance the number of gray scales expressed.

In accordance with the present invention, a display device is provided, and the display device has a memory for storing one frame period of digital video signals,
wherein the one frame period is divided into a plurality of sub-frame periods,
wherein turn on or turn off is performed in the sub-frame periods, and gray scales are expressed by the total amount of turn on time within the one frame period, and
wherein the digital video signals stored in the memory are read out at different frequencies.

In accordance with the present invention, a display device is provided, and the display device has:
a display:
a display controller for supplying a clock signal: and
a memory for storing one frame period of digital video signals.
wherein one frame period is divided into a plurality of sub-frame period.
wherein turn on or turn off is performed in the sub-frame periods, and gray scales are expressed by the total amount of turn on time within the one frame period, and
wherein the display controller supplies clock signals with different frequencies to the display in accordance with the number of gray scales expressed, and the digital video signals stored in the memory are read out at different frequencies.

In accordance with the present invention, a display device is provided, and the display device has:
a display; and
a display controller for supplying a clock signal,
wherein one frame period is divided into a plurality of sub-frame periods,
wherein turn on or turn off is performed in the sub-frame periods, and gray scales are expressed by the total amount of turn on time within the one frame period,
wherein there is a first display mode in which the one frame period is divided into n sub-frame periods (where n is a natural number), and a second display mode in which the one frame period is divided into m sub-frame periods (where m is a natural number less than n), and
wherein the display controller supplies a clock signal with a different frequency to the display in the first display mode from in the second display mode.

In accordance with the present invention, a display device is provided, the display device has a memory for storing one frame period of digital video signals,
wherein the one frame period is divided into a plurality of sub-frame periods,
wherein turn on or turn off is performed in the sub-frame periods, and gray scales are expressed by the total amount of turn on time within the one frame period,
wherein there is a first display mode in which the one frame period is divided into n sub-frame periods (where n is a natural number), and a second display mode in which the one frame period is divided into m sub-frame periods (where m is a natural number less than n); and
wherein the digital video signals stored in the memory are read out at a different frequency in the first display mode from in the second display mode.

In accordance with the present invention, a display device is provided, the display device has:
a display;
a display controller for supplying a clock signal; and
a memory for storing one frame period of digital video signals,
wherein one frame period is divided into a plurality of sub-frame periods,
wherein turn on or turn off is performed in the sub-frame periods, and gray scales are expressed by the total amount of turn on time within the one frame period,
wherein there is a first display mode in which the one frame period is divided into n sub-frame periods (where n is a natural number), and a second display mode in which the one frame period is divided into m sub-frame periods (where m is a natural number less than n); and
wherein the display controller supplies a clock signal with a different frequency to the display in the first display mode from in the second display mode, and the digital video signals stored in the memory are read out at a different frequency in the first display mode from in the second display mode.

The display device may also be one in which the brightness during turn on in the sub-frame periods differs in accordance with the number of gray scales expressed.

The display device may also be one in which the brightness during turn on in the sub-frame periods differs between the first display mode and the second display mode.

In accordance with the present invention, a display device is provided, the display device has a display and a memory.
wherein the display has a plurality of pixels,
wherein each of the plurality of pixels has a light emitting element,
wherein digital video signals are written to the memory, wherein a digital image signal is output to the display from the memory, wherein one frame period is divided into a plurality of sub-frame periods, wherein each of the plurality of sub-frame periods has a write in period for inputting the digital image signal to the plurality of pixels, and a display period for placing the light emitting elements into a light emitting state or a non-light emitting state in accordance with the digital image signal input to the plurality of pixels during the write in period, wherein display of an image is performed by switching between: a first display mode in which gray scales are expressed by using first bit to n-th bit signals (where n is a natural number) of the digital video signal; and a second display mode in which gray scales are expressed by using first bit to m-th bit signals (where m is a natural number less than n) of the digital video signal.

wherein the first bit to n-th bit signals of the digital video signal are stored in the memory in the first display mode, and the first bit to the m-th bit signals of the digital video signal are stored in the memory in the second display mode, and wherein the write in period and the display period of the sub-frame period corresponding to a t-bit (where t is a natural number less than m) in the second display mode are respectively longer than the write in period and the display period of the sub-frame period corresponding to a t-bit in the first display mode.

In accordance with the present invention, a display device is provided, the display device has a display and a memory, wherein the display has a plurality of pixels, wherein each of the plurality of pixels has a light emitting element, wherein digital video signals are written to the memory, wherein a digital image signal is output to the display from the memory, wherein one frame period is divided into a plurality of sub-frame periods, wherein each of the plurality of sub-frame periods has a write in period for inputting the digital image signal to the plurality of pixels, and a display period for placing the light emitting elements into a light emitting state or a non-light emitting state in accordance with the digital image signal input to the plurality of pixels during the write in period, wherein display of an image is performed by switching between: a first display mode in which gray scales are expressed by using first bit to n-th bit signals (where n is a natural number) of the digital video signal; and a second display mode in which gray scales are expressed by using first to m-th bit signals (where m is a natural number less than n) of the digital video signal, wherein n sub-frame periods exist in the first display mode, wherein the ratio of lengths of display periods Ts1 to Tsn which the n sub-frame periods respectively have is $2^0:2^{-1}:2^{-(n-2)}:2^{-(n-1)}$, wherein m sub-frame periods exist in the second display mode.

wherein the ratio of lengths of display periods Ts1 to Tsm of the which the m sub-frame periods respectively have is $2^0:2^{-1}:2^{-(m-2)}:2^{-(m-1)}$, wherein switching takes place between the first display mode in which the first bit to the n-th bit signals of the digital video signal are stored in the memory, and the second display mode in which the first bit to the m-bit signals of the digital video signal are stored in the memory, and wherein the write in period and the display period of the sub-frame period corresponding to a t-bit in the second display mode are respectively longer than the write in period and the display period of the sub-frame period corresponding to a t-bit in the first display mode (where t is a natural number less than m).

The display device may also be one in which the electric potential of the opposing electrode of the light emitting element is changed so that the brightness of light emitted from the light emitting element in a light emitting state becomes less in the display period corresponding to the t-bit in the second display mode, than that in the display period corresponding to the t-bit in the first display mode.

In accordance with the present invention, a display device is provided, the display device has a signal control circuit, a display controller, and a display, wherein the display has a source signal line driver circuit, a gate signal line driver circuit, and a plurality of pixels, wherein each of the plurality of pixels has a light emitting element, wherein the signal control circuit has a CPU, a memory, and a memory controller, wherein the display controller inputs a clock pulse for the source signal line driver circuit and a start pulse for the source signal line driver circuit to the source signal line driver circuit, and inputs a clock pulse for the gate signal line driver circuit and a start pulse for the gate signal line driver circuit to the gate signal line driver circuit.

wherein digital video signals are written to the memory, wherein a digital image signal is output from the memory to the display, wherein one frame period is divided into a plurality of sub-frame periods, wherein each of the plurality of sub-frame periods has a write in period for inputting the digital image signal to the plurality of pixels, and a display period for placing the light emitting elements into a light emitting state or a non-light emitting state in accordance with the digital image signal input to the plurality of pixels during the write in period, wherein display of an image is performed by switching between a first display mode in which gray scales are expressed by using first bit to n-th bit signals (where n is a natural number) of the digital video signal, and a second display mode in which gray scales are expressed by first to a m-bit signals (where m is a natural number less than n) of the digital video signal, wherein, in the first display mode, the memory controller writes the first bit to n-th bit of the digital video signal to the memory from the CPU, and further, outputs the digital video signal written into the memory to the source signal line driver circuit as the digital image signal, wherein, in the second display mode, the memory controller writes the first bit to m-bit of the digital signal to the memory from the CPU, and further, outputs the digital video signal written into the memory to the source signal line driver circuit as the digital image signal, and wherein the display controller lowers frequency of each of the clock pulse for the source signal line driver circuit, the start pulse for the source signal line driver circuit, the clock pulse for the gate signal line driver circuit, and the start pulse for the gate signal line driver circuit in the second display mode compared to those in the first display mode.

The display device may also be one in which:

the display controller has a variable frequency divider circuit;

a gray scale controller signal is input to the variable frequency divider circuit; and frequency of each of the clock pulse for the source signal line driver circuit, the start pulse for the source signal line driver circuit, the clock pulse for the gate signal line driver circuit, and the start pulse for the gate signal line driver circuit are made lower in the second display mode compared to those in the first display mode.

The display device may also be one in which:

the display controller has an electric power source controller circuit used for the light emitting element; and the electric potential of the opposing electrode of the light emitting element is changed so that the brightness of light emitted from the light emitting element in a light emitting state becomes less in the display period corresponding to the t-bit in the second display mode, than that in the display period corresponding to the t-bit in the first display mode (where t is a natural number less than m).

The display device of the present invention may be used in video cameras, DVD playback devices, television receivers, heat mounted displays, portable information terminals personal computers, and the like.

BRIEF DESCRIPTION OF THE DRAWINGS

In the accompanying drawings:

FIG. 6 is a block diagram showing the structure of the display device of the present invention;

FIG. 11 is a diagram showing a structure of a memory controller of the conventional display device;

FIGS. 14A to 14F are diagrams showing electronic equipment of the present invention;

DETAILED DESCRIPTION OF THE PREFERRED EMBODIMENTS

An embodiment mode of the present invention is explained.

Figure 1:
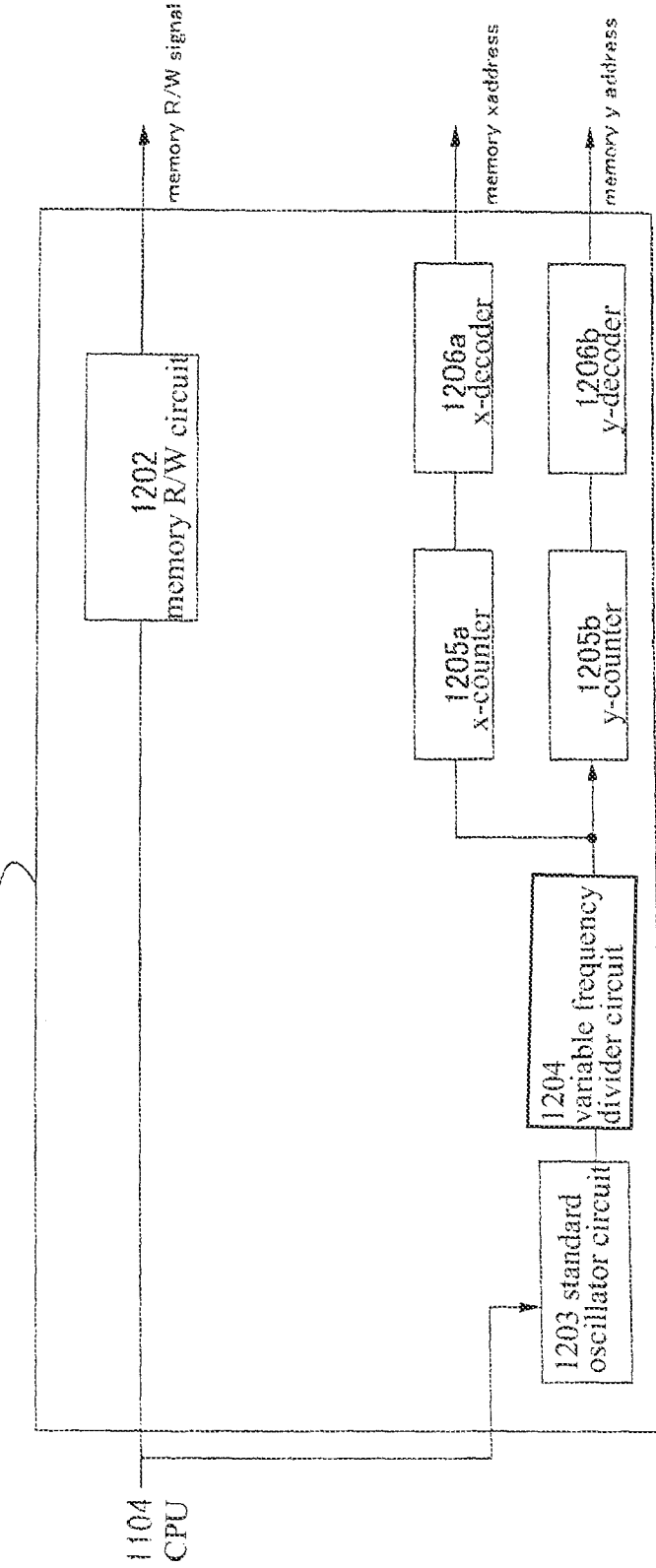
FIGS. 1A and 1B are diagrams showing timing charts for a method of driving a display device of the present invention.
Figure 12:
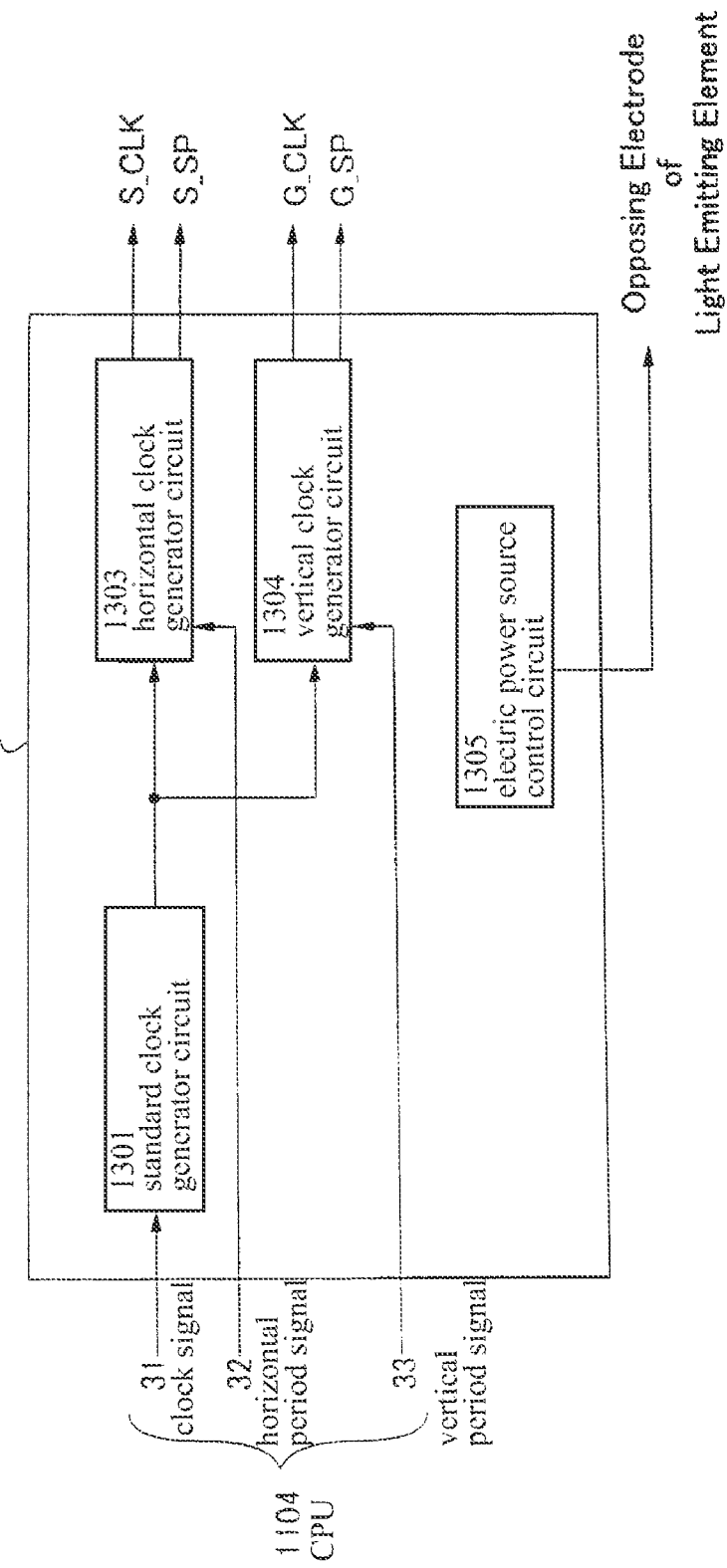
FIG. 12 is a diagram showing a structure of a display controller of the conventional display device.

Timing charts for a method of driving a display device of the present invention are shown in FIGS. 1A and 1B.

A display device into which a 4-bit digital video signal is input, is focused upon in FIGS. 1A and 1B. A 4-bit digital image signal is input to a display to perform display of an image in a first display mode. In a second display mode, a gray scale is expressed by a 1-bit digital image signal, using only the most significant one bit of the digital video signal from among the four bits of the digital video signal. Although an example is explained in the embodiment mode using the aforementioned case, a display device of the present invention is not limited to this case.

In general, a display device into which an n-th bit digital video signal (where n is a natural number) is input, is focused upon. It is possible to express $2^n$ gray scales by using n sub-frame periods SF1 to SFn and the n-th bit digital image signal in the first display mode. On the other hand, $2^m$ gray scales are expressed by using an m-bit digital image signal (where m is a natural number less than n) in the second display mode in accordance with switch-over operation. The present invention can also be applied to such a case.

Further, a display device into which n-th bit digital video signal is input (where n is a natural number) is more generally focused upon. In the first display mode, the n-th bit digital image signal is input, and it is possible to express w gray scales (where w is a natural number) using r sub-frame periods (where r is a natural number). On the other hand, u gray scales (where u is a natural number smaller than w) are expressed in the second display mode by using s sub-frame periods (where s is a natural number less than r) and m-th bit the digital image signal (where m is a natural number less than n) in accordance with switch-over operation. The present invention can also be applied to such a case.

A timing chart in a case of the first display mode, in which the 4-bit signal is input and 2gray scales are expressed, is shown in FIG. 1A.

Each pixel is selected to be in a light emitting state or in a non-light emitting state in a display period in each of sub-frame periods SF1 to SF4 structuring one frame period. An opposing electric potential is set to be nearly the same as an electric power source electric potential during write in periods, and is changed in the display periods so as to have an electric potential difference from the electric power source electric potential to an extent that light emitting elements will emit light.

These operations are similar to the conventional example, and a detailed explanation is therefore omitted.

A timing chart in a case of the second display mode for expressing gray scales using only the most significant one bit signal is shown in FIG. 1B.

Compared to the first display mode shown in FIG. 1A, the write in period and the display period are set longer, and one frame period roughly corresponds to a first sub-frame period.

The structure of a display device for performing the aforementioned driving operations is explained below.

Figure 4:
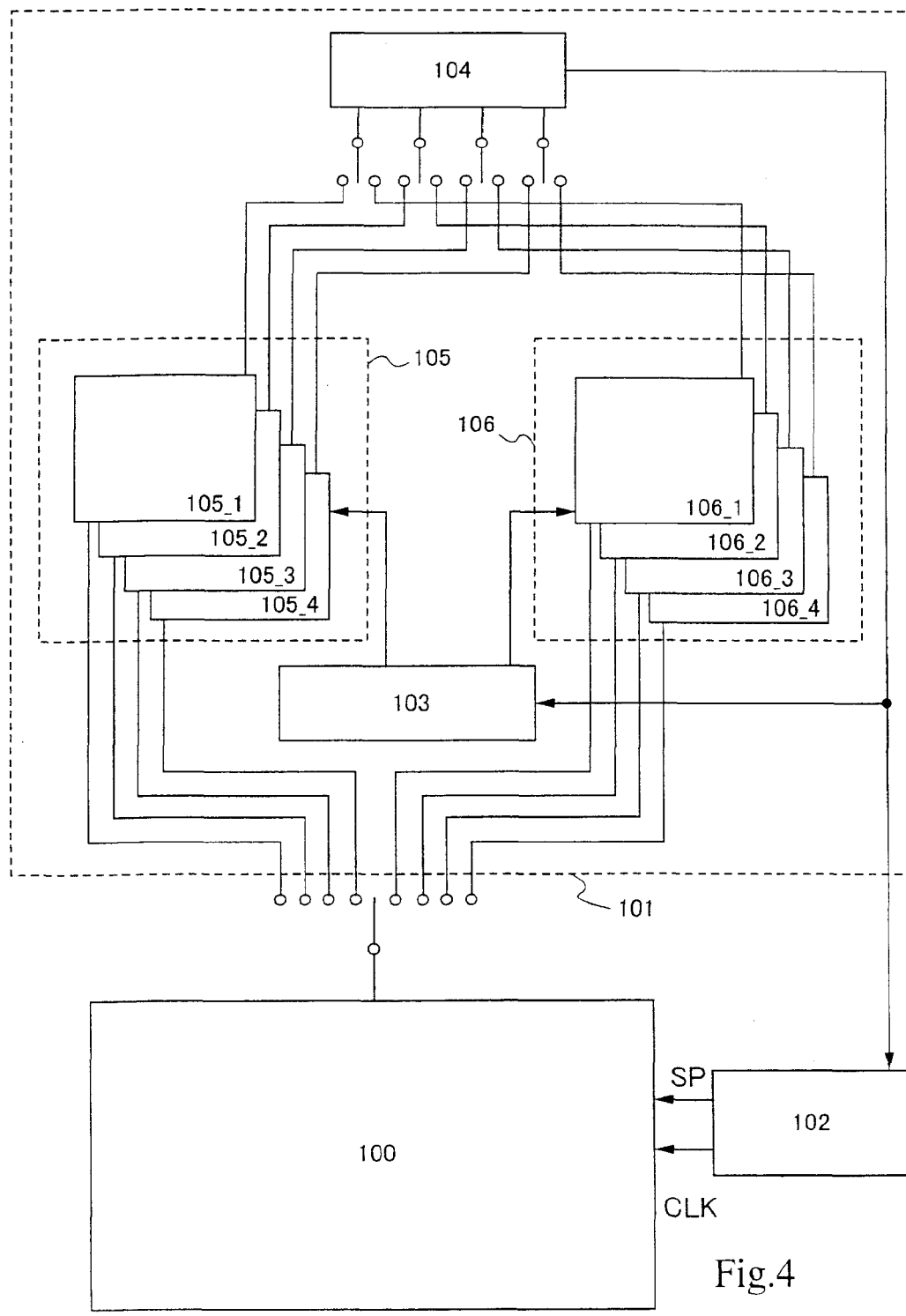
FIG. 4 is a clock diagram showing a structure of the display device of the present invention.
Figure 5A:
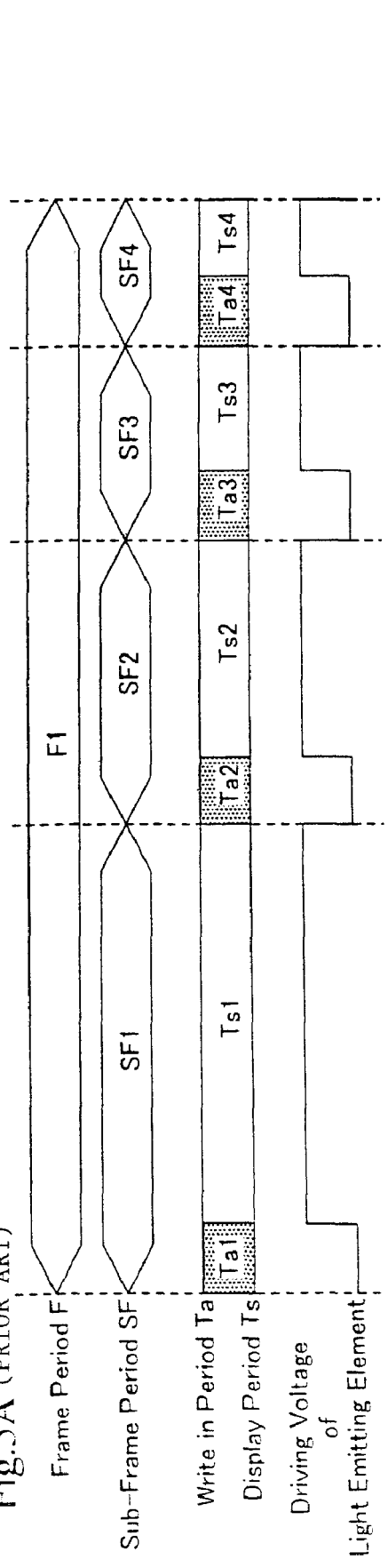
FIGS. 5A and 5B are diagrams showing timing charts for a time gray scale driving method.
Figure 5B:
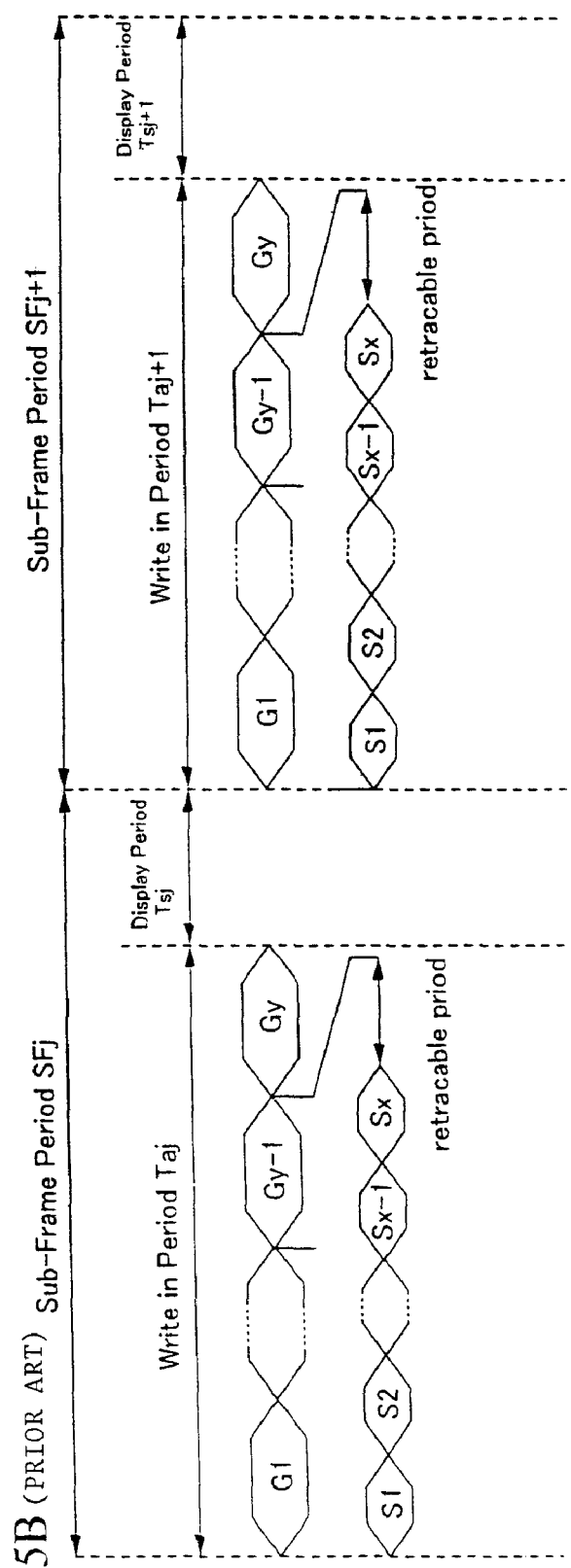
Figure 7:
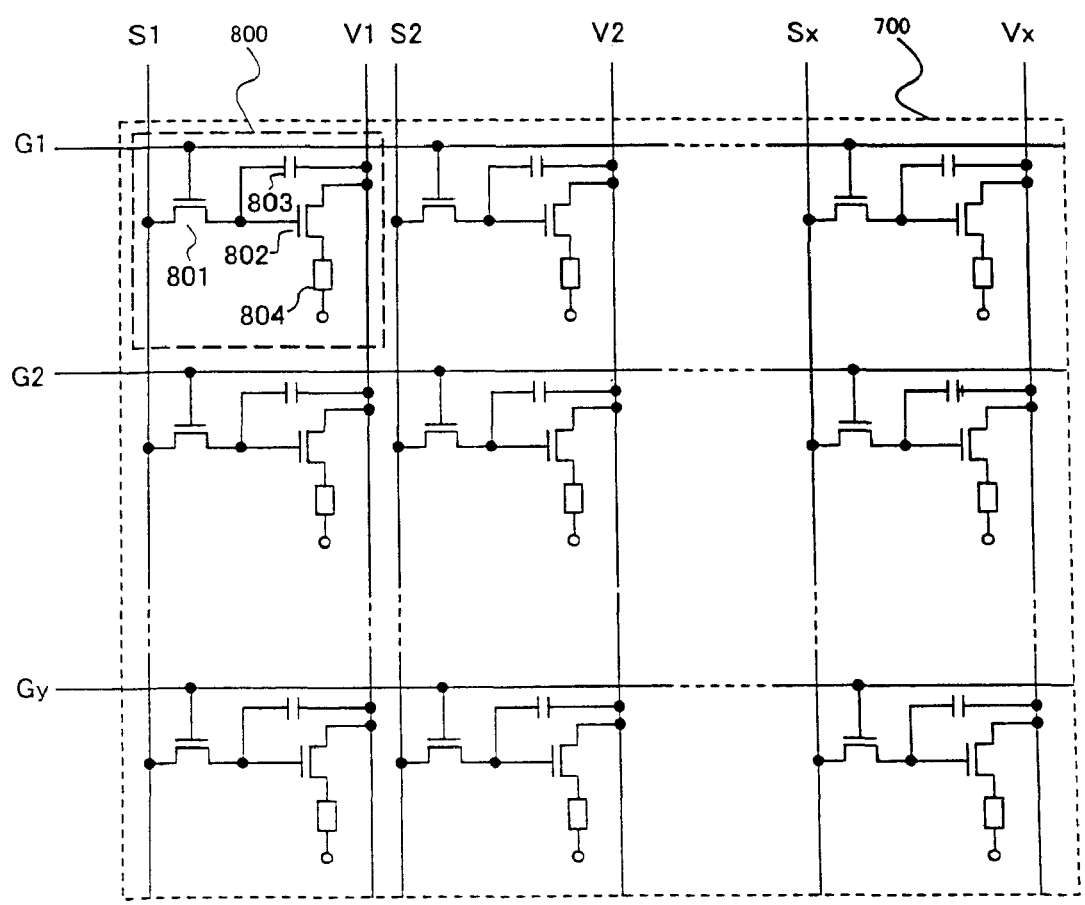
FIG. 7 is a diagram showing a structure of a pixel portion of the display device.

A block diagram of the display device for performing the above operations is shown in FIG. 4 and FIG. 6.

The display device is structured by a signal control circuit 101, a display controller 102, and a display 100.

The display controller 102 supplies a start pulse SP and a clock pulse CLK to the display 100.

The signal control circuit 101 is structured by a CPU 104, a memory A 105, a memory B 106, and a memory controller 103.

An example of a display device is shown in FIG. 4 into which the 4-bit digital video signal is input, and which expresses gray scales using the 4-bit digital image signal in the first display mode. The memory A 105 is structured by memories 105_1 to 105_4 for storing a first bit to a fourth bit, respectively, of the digital video signal. Similarly, the memory B 106 is structured by memories 106_1 to 106_4 for storing a first bit to a fourth bit, respectively, of the digital video signal. The memories corresponding to each bit of the digital signal each have a plurality of memory elements capable of storing one bit of the signal as many as the number of pixels structuring one screen.

In general, the memory A is structure by memories 105_1 to 105_n for storing a first bit to a n-th bit of information, respectively, in a display device which is capable of expressing gray scales by using an n-th bit digital image signal. Similarly, the memory B is structure by memories 106_1 to 106_n for storing the first bit to the n-th bit of information, respectively. The memories corresponding to each bit of information each have a capacity that is capable of storing one bit of the signal as many as the number of pixels structuring one screen.

Figure 2:
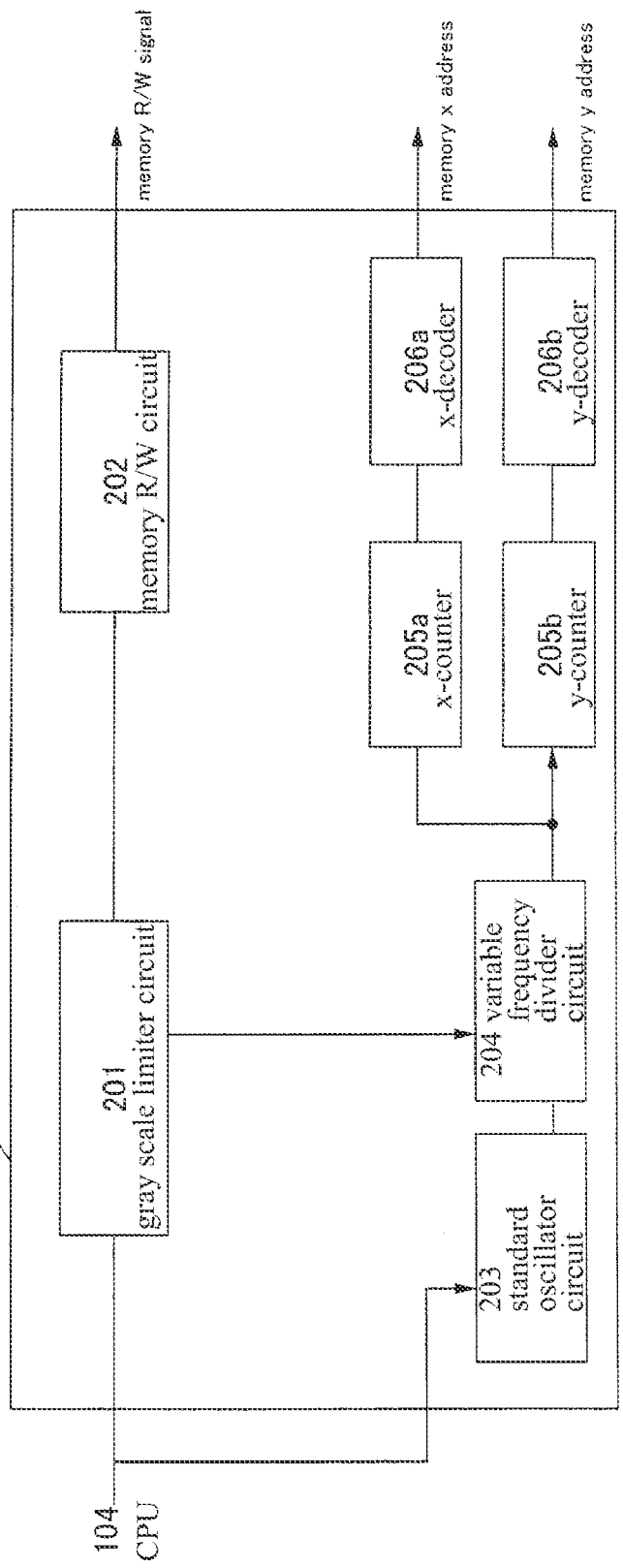
FIG. 2 is a diagram showing a structure of a memory controller of the display device of the present invention.

The structure of the memory controller 103 of FIG. 4 is shown in FIG. 2.

The memory controller 103 is structured by a gray scale limiter circuit 201, a memory R/W circuit 202, a standard oscillator circuit 203, a variable frequency divider circuit 204, an x-counter 205a, a y-counter 205b, an x-decoder 206a, and a y-decoder 206b in FIG. 2.

The above-described memory A and the memory B are both taken together and denoted as memory. Furthermore, the memory is structured by a plurality of memory elements. The memory elements are selected by using (x,y) addresses.

A signal from the CPU 104 is input to the memory R/W circuit 202 through the gray scale limiter circuit 201. The gray scale limiter circuit 201 inputs the signal to the memory R/W circuit 202 in accordance with either the first display mode or the second display mode. The memory R/W circuit 202 selects whether or not to write the digital video signal corresponding to each bit into the memory, in accordance with the signal from the gray scale limiter circuit 201. Similarly, the digital signal written into the memory is selected in read out operation.

Further, the signal from the CPU 104 is input to the standard oscillator circuit 203. A signal from the standard oscillator circuit 203 is input to the variable frequency divider circuit 204, and converted to a signal with a suitable frequency. A signal from the gray scale limiter circuit 201 is input to the variable frequency divider circuit 204, in accordance with either the first display mode or the second display mode. Based on the input signal, a signal from the variable frequency divider circuit 204 selects the x-address of the memory, through the x-counter 205a and the x-decoder 206a. Similarly, a signal from the variable frequency divider circuit 204 is input to the y-counter 205b and to the y-decoder 206b, and selects the y-address of the memory.

The amount of information for the signal written into the memory and for the signal (digital image signal) output from the memory, taken from the digital video signal input to the signal controller circuit, can be controlled by using memory controller 103 with the above structure in the case where high level gray scale display is not necessary. Further, the frequency for reading out the signal from the memory can be changed.

The above describes the memory controller 103.

Further, the structure of the display controller 102 in FIG. 4 is explained.

Figure 3:
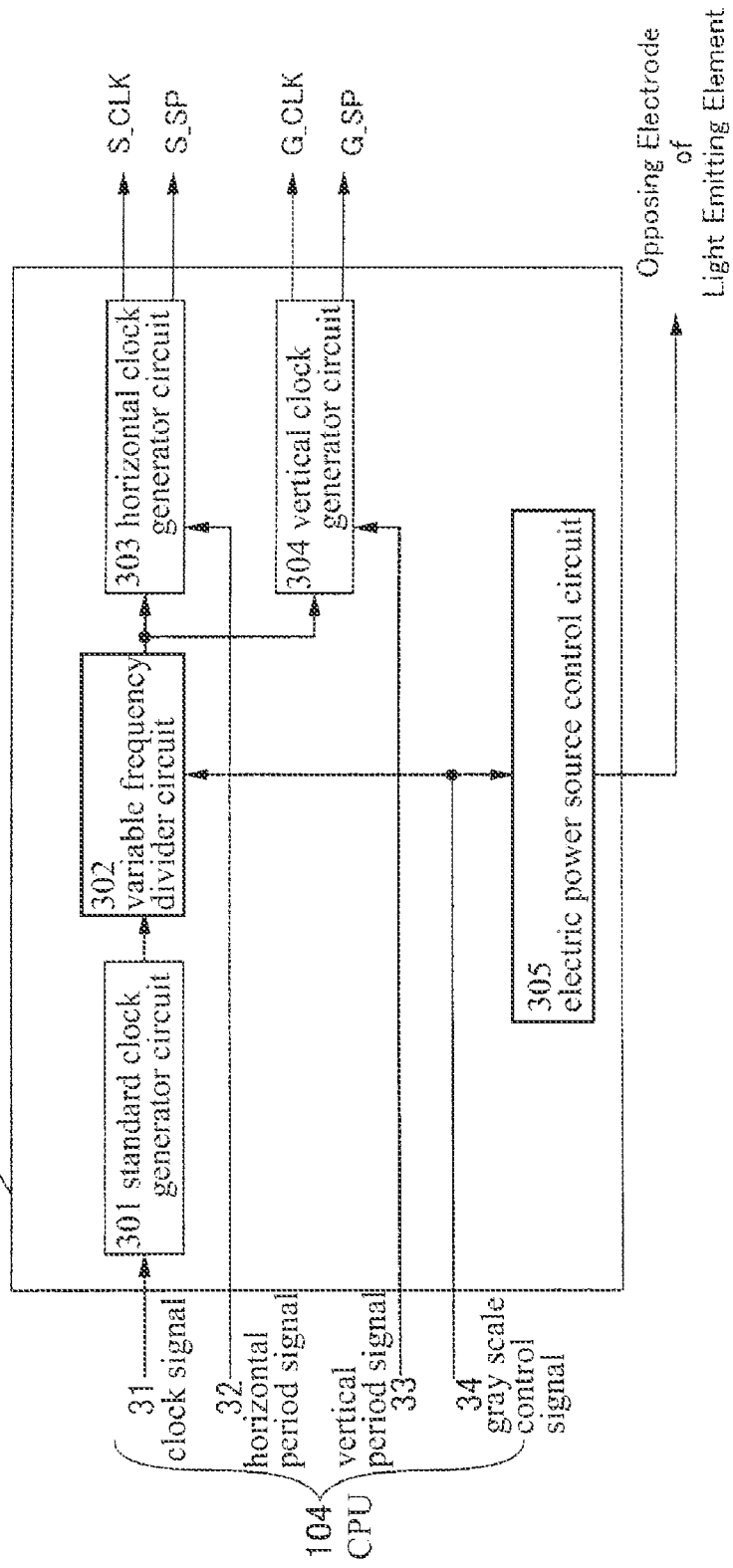
FIG. 3 is a diagram showing a structure of a display controller of the display device of the present invention.

FIG. 3 is a diagram showing the structure of the display controller of the present invention.

The display controller 102 is structured by a standard clock generator circuit 301, a variable frequency divider circuit 302, a horizontal clock generator circuit 303, a vertical clock generator circuit 304, and an electric power source 305 used for the light emitting elements.

A clock signal 31 input from the CPU 104 is input to the standard clock generator circuit 301, and a standard clock is generated. The standard clock is input to the horizontal clock generator circuit 303 and to the vertical clock generator circuit 304, through the variable frequency divider circuit 302. A gray scale control signal 34 is input to the variable frequency divider circuit 302. The frequency of the standard clock is changed in accordance with the gray scale control signal 34.

The extent that the frequency of the standard clock is changed in the variable frequency divider circuit 302 can be suitably determined by the operator. This is because the sub-frame periods in the first display mode, which are corresponding to the bits participating in the expression of gray scales in the second display mode, differ in accordance with their occupied proportion to one frame period.

In other words, in the second display mode, the sub-frame periods within one frame period are cut with respect to the first display mode. With the present invention, the effective display period within one frame period is set longer even in the second display mode, and therefore the standard clock frequency is changed in the variable frequency divider circuit 302. The percentage of the change in the frequency can be determined in accordance with the proportion of bits removed.

Further, a horizontal period signal 32 which determines a horizontal period is input to the horizontal clock circuit 303 from the CPU 104, and the clock pulse S_CLK and the start pulse S_SP for the source signal line driver circuit are output. Similarly, a vertical period signal 33 which determines a vertical period is input to the vertical clock circuit 304 from the CPU 104, and the clock pulse G_CLK and the start pulse G_SP for the gate signal line driver circuit are output.

The above explains the display controller 102.

The display device of the present invention thus eliminates read out of the less significant bits of the signal from the memory in the memory controller of the signal controller circuit during the second display mode. Further, the frequency for reading out signals from the memory is made smaller. Corresponding to these operations, the display controller lowers the frequency of the sampling pulse SP and the frequency of the clock pulse CLK input to each of the driver circuits (the source signal line driver circuit and the gate signal line driver circuit), and lengthens the write in period and the display period of the sub-frame period for expressing the image.

For example, one frame period is divided into four sub-frame periods in the first display mode. With the ratio of the display periods Ts1, Ts2, Ts3, and Ts4 of the respective sub-frame periods set to be $2^0::2^{-1}::2^{-2}::2^{-3}$, a display device for expressing $2^4$ gray scales using a 4-bit digital image signal is considered. For simplicity, the lengths of the display periods Ts1 to Ts4 of each sub-frame period are taken to be 8, 4, 2, and 1, respectively. Further, the lengths of the write in periods Ta1 to Ta4 of each sub-frame period are taken to be 1. Furthermore, a case of expressing gray scales using the most significant bit of the signal in the second display mode is considered.

The occupied proportion per one frame period by the sub-frame period in the first display mode, that corresponds to the bit participating in gray scale expression in the second display mode, becomes 9/19.

In other words, the sub-frame period participating in gray scale expression in the second display mode is the sub-frame period (denoted by the reference symbol SF1) corresponding to the most significant bit. The occupied proportion per one frame period by SF1 in the first display mode is 9/19.

Figure 9:
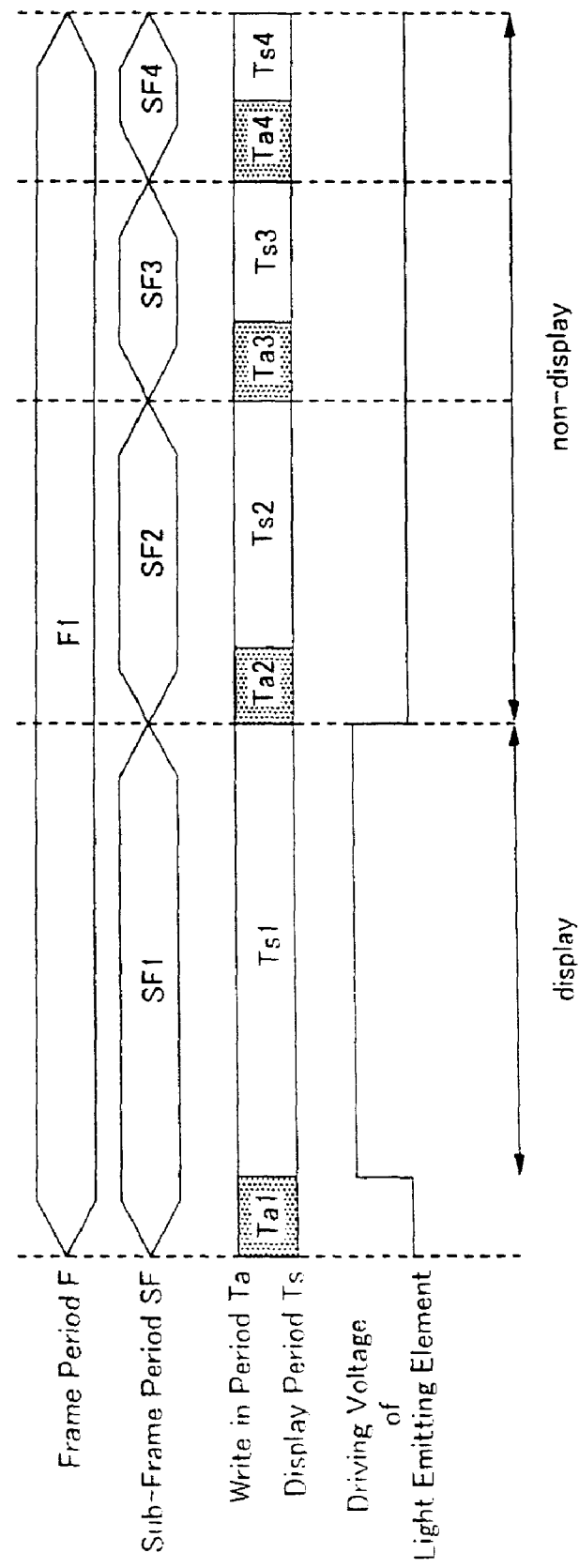
FIG. 9 is a diagram showing a timing chart of a conventional method of driving a display device
Figure 10:
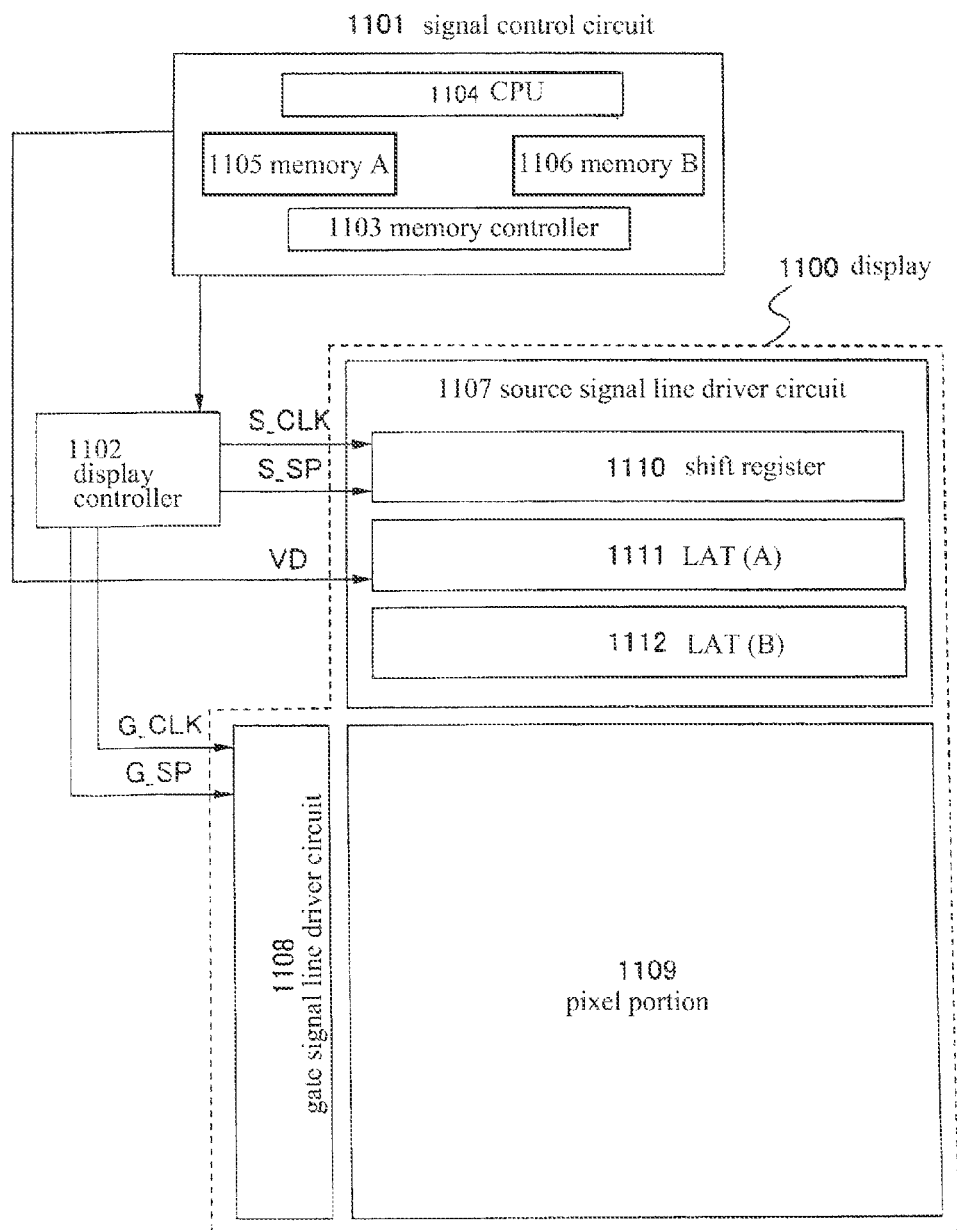
FIG. 10 is a block diagram showing a structure of the conventional display device.

If the structure of the present invention is not used, for example, as a case of using the conventional driving method shown in FIG. 9, 10/19 of one frame period becomes the period which is not participating in display.

On the other hand, in accordance with the structure of the present invention, the frequency of the clock signal or the like input to each driver circuit of the display is changed in the second display mode, and the write in period is set to have a length that is 19/9 times the length of the write in period in the first display mode. Similarly, the display period is also set to have a length that is 19/9 times the length of the display period Ts1 of the sub-frame period SF1 which is corresponding to the most significant bit in the first display mode. The sub-frame period Sf1 can thus be made to occupy one frame period. The periods which do not participate in display during one frame period can thus be reduced in the second display mode.

In general, a display device which has a first display mode for expressing gray scales using a first bit to a n-th bit signal (where n is a natural number), and has a second display mode for expressing gray scales using the first bit to a m-th bit signal (where m is a natural number less than n) is focused upon.

The occupied proportion per one frame period by the sub-frame periods in the first display mode, that correspond to the bits participating in gray scale expression in the second display mode, becomes 1/q (where q is a number greater than 1).

In other words, a case, in which the occupied proportion per one frame period by the sub-frame periods corresponding to the first bit to the m-th bit is 1/q (where q is a number greater than 1) in the first mode, is considered.

In a sub-frame period corresponding to a t-th bit in the second display mode (where t is a natural number less than or equal to m), the frequency of each signal (such as clock pulses and start pulses) input to each driver circuit of the display (the source signal line driver circuit and the gate signal line driver circuit) is changed to be 1/q times its original value. and a write in period with a length that is q times the length of the write in period of the sub-frame period corresponding to the t-th bit in the first display mode is set. Similarly, in accordance with setting the length of the display period to be q times the length of the display period of the sub-frame period corresponding to the t-th bit in the first display mode (where t is a natural number less than or equal to m), display of an image can also be performed by sufficient use of one frame period.

The display period per one frame period of the light emitting element can thus also be made increased in the second display mode.

Therefore, in the second display mode, the brightness of the light emitting element selected to be in a light emitting state in the display period of the sub-frame period corresponding to the most significant bit can be made smaller compared to the brightness of the light emitting element selected to be in a light emitting state in the display period of the sub-frame period corresponding to the most significant bit in the first display mode. Consequently, the voltage applied between an anode and a cathode of the light emitting element can be set lower in the display periods with the second display mode.

A method of changing the voltage applied between the anode and the cathode of the light emitting element in accordance with the display mode, is explained.

During the write in period, the electric power source control circuit 305 in FIG. 3 used for the light emitting element maintains the electric potential of the opposing electrode (opposing electric potential) of the light emitting element at an electric potential which is nearly the same as the electric power source electric potential. In the display period, the electric potential of the opposing electrode of the light emitting element is controlled so as to have an electric potential difference from the electric power source electric potential to an extent that the light emitting element will emit light. The gray scale control signal 34 is also input to the electric power source control circuit 305 here. The electric potential of the opposing electrode of the light emitting element is thus changed in order that the voltage applied between both electrodes of the light emitting element becomes smaller by an amount that the light emitting period for the light emitting element becomes longer.

In general, a case is considered, in which the display period of a sub-frame period corresponding to the t-th bit in the second display mode (where t is a natural number less than or equal to m) is set to have a length that is q times the length of the display period of the sub-frame period corresponding to the t-th bit in the first display mode (where q is a number larger than 1). The brightness of the light emitting element selected to be in a light emitting state in the sub-frame period corresponding to the t-th bit in the second display mode can be set equal to 1/q times the brightness of the light emitting element selected to be in a light emitting state in the sub-frame period corresponding to the t-th bit in the first display mode.

The voltage applied between both the electrodes of the light emitting element can be made smaller in the second display mode, and therefore stress on the light emitting element due to the applied voltage can also be made smaller.

Note that although the display device shown is one which switches between the first display mode and the second display mode, the present invention can also be applied to a case in which, in addition to the first display mode and the second display mode, at least one more mode in which the number of gray scales expressed is changed are additionally established, and display is performed by switching between the plurality of modes.

Figure 8:
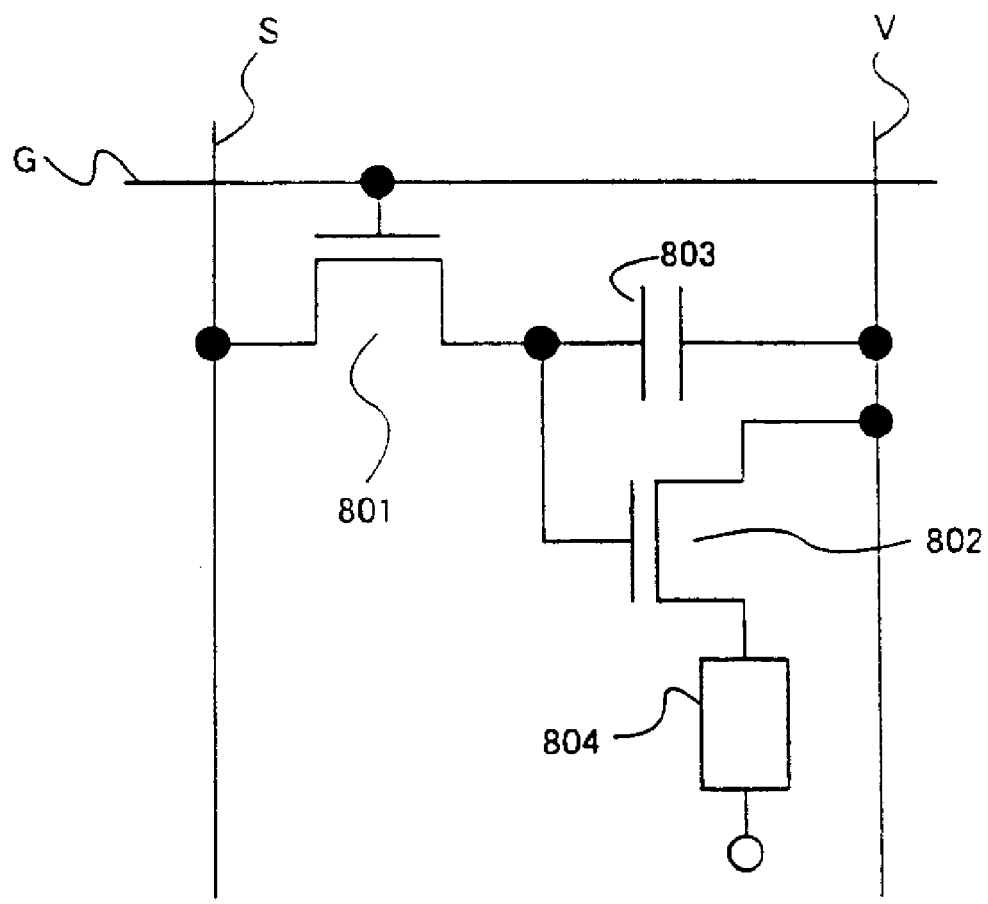
FIG. 8 is a diagram showing a structure of a pixel of the display device.

Pixels with the structure shown in FIG. 8 in the conventional example can be used here to structure the pixel portion of the display of the display device according to the present invention. Further, pixels with another known structure can also be freely used.

For example, the following two types of pixels can be applied. The first type is a pixel in which the brightness of a light emitting element is determined by setting the voltage applied between the anode and the cathode of the light emitting element. The pixel with the structure shown in FIG. 8 corresponds to this type. The second type is a pixel in which the brightness of the light emitting element is determined by setting the electric current flowing through the light emitting element.

Furthermore, circuits with known structures can be freely used for the source signal line driver circuit and the gate signal line driver circuit of the display of the display device according to the present invention.

In addition, it is also possible to apply the present invention not only to a display device using OLED elements, but also to self-light emitting type display devices using FDPs, PDPs, and the like as light emitting elements.

Embodiments

Embodiments of the present invention are explained below.

[Embodiment 1]

An example of the structure of a source signal line driver circuit of a display device according to the present invention is explained in Embodiment 1.

Figure 15:
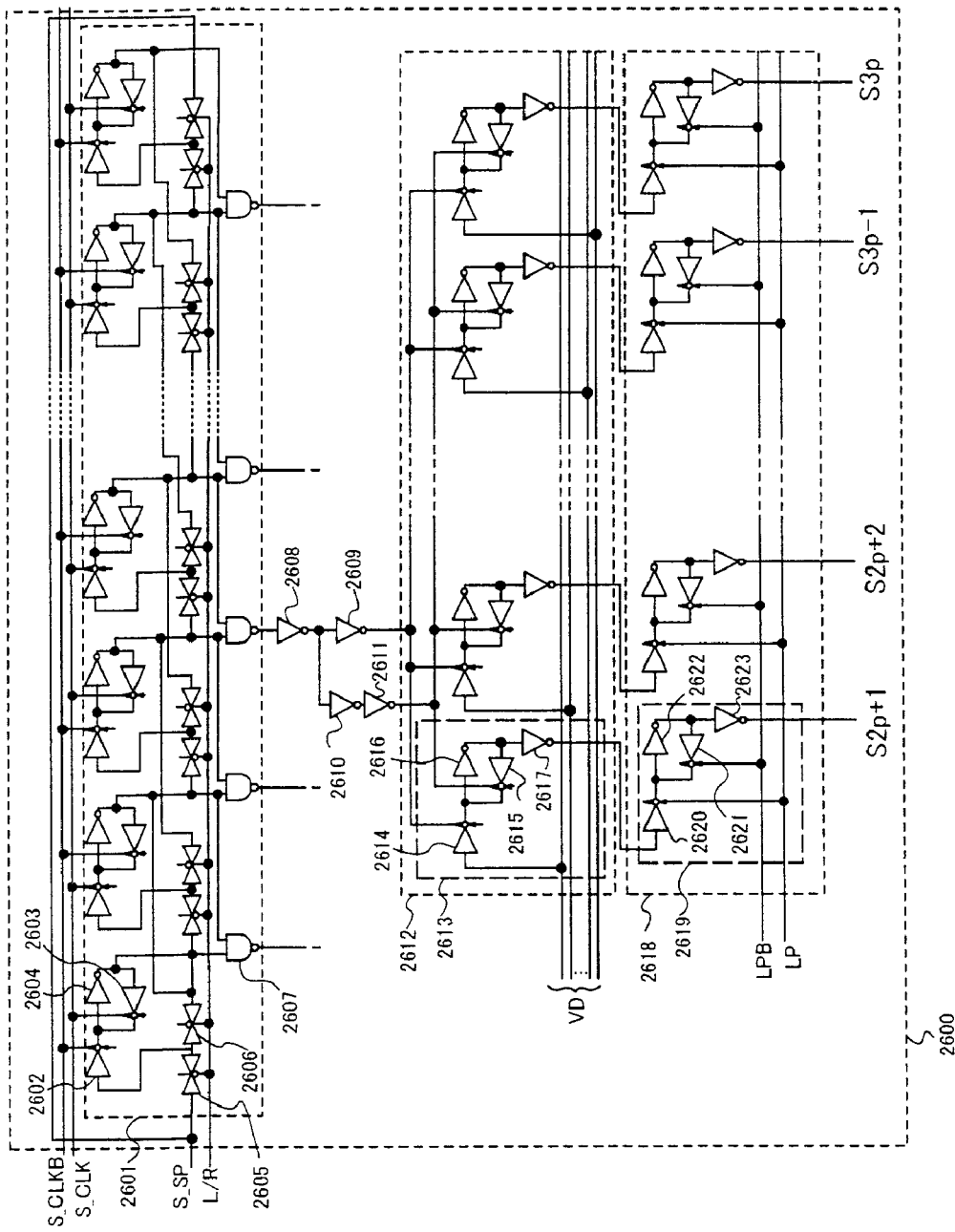
FIG. 15 is a diagram showing a structure of a source signal line driver circuit of the display device of the present invention.

FIG. 15 shows an example of the structure of a source signal line driver circuit.

The source signal line driver circuit is structured by a shift register, a scanning direction switching circuit, an LAT (A) and an LAT (B). Note that, although only an LAT (A) portion 2612 and an LAT (B) portion 2618 which are corresponding to one of outputs from the shift register are shown in FIG. 15, the LAT (A) and the LAT (B) correspond to all of the outputs from the shift register using a similar structure.

A shift register 2601 is structure clocked inverters 2602 and 2603, an inverter 2604, and a NAND 2607. A start pulse S_SP for the source signal line driver circuit is input to the shift register 2601. By changing the state of the clocked inverters 2602 and 2603 between a conductive state and a non-conductive state in accordance with a clock pulse S_CLK for the source signal line driver circuit and an inverted clock pulse S_CLKB for the source signal line driver circuit which has an inverse polarity to that of the clock pulse S_CLK, sampling pulses are output in order from the NAND 2607 to the LAT (A).

Further, the scanning direction switching circuit is structure by a switch 2605 and a switch 2606, and works to switch the operation direction of the shift register between left and right directions. In FIG. 15, the shift register outputs sampling pulses in order from the left to the right in the case in which a left and right switching signal L/R corresponds to a Lo signal. On the other hand, if the left and right switching signal L/R is a Hi signal, then sampling pulses are output in order from the right to the left.

Each stage of an LAT (A) 2613 is structured by clocked inverters 2614 and 2615, and inverters 2616 and 2617.

The term "each stage of the LAT (A)" denotes an LAT (A) for taking in an image signal input to one source signal line here.

A digital image signal VD output from the signal control circuit explained in the embodiment mode is input in p divisions (where p is a natural number) here. That is, signals corresponding to output to p source signal lines are input in parallel. If a sampling pulse is input at the same time to the clocked inverters 2614 and 2615 of p stages of the LAT (A) 2612 through buffers 2608 to 2611, then the respective input signals in p divisions are sampled simultaneously in p stages of the LAT (A) 2612.

A source signal line driver circuit 2600 for outputting signal currents to x source signal lines is explained here, and therefore x/p sampling pulses are output in order from the shift register per one horizontal period. The p stages of the LAT (A) 2613 simultaneously sample the digital image signals which are corresponding to output to the p source signal lines in accordance with each sampling pulse.

A read in method, in which the digital image signals thus input to the source signal line driver circuit are divided into parallel signals of p phases and the p digital images signals are taken in by using one sampling pulse, is referred to as p-division drive in this specification.

A margin can be given to the sampling of the shift register in the source signal line driver circuit by performing the above-stated division drive. The reliability of the display device can thus be increased.

When all of the signals for one horizontal period are input to each stage of the LAT (A) 2613, a latch pulse LP and an inverted latch pulse LPB which has a inverse polarity to the latch pulse LP are input, and the signals input to each stage of the LAT (A) 2613 are all output simultaneously to each stage of an LAT (B) 2619.

Note that the term "each stage of the LAT (B)" used here denotes an LAT (B) circuit to which the signal from each stage of the LAT (A) is input.

The LAT (B) 2619 is structured by clocked inverters 2620 and 2621, and inverters 2622 and 2623. The signal output from the LAT (A) 2613 is stored in the LAT (B) and at the same time is output to each of source signal lines S1 to Sx.

Note that, although not shown in the figures, circuits such as level shifters and buffers may also be suitably formed.

Signals such as the start pulse S_SP and the clock pulse S_CLK, input to the shift register, the LAT (A), and the LAT (B), are input from the display controller shown in the embodiment mode of the present invention.

With the present invention, operations for inputting a digital image signal with a small number of bits to the LAT (A) of the source signal line driver circuit are performed by the signal controller circuit. At the same time, operations for reducing the frequency of the clock pulse S_CLK, the start pulse S_SP, and the like, input to the shift register of the source signal line driver circuit, are performed by the display controller.

Operations for sampling the digital image signal by the source signal line driver circuit can thus be reduced in the second display mode, and the electric power consumption of the display device can be curbed.

Note that the source signal line driver circuit of the display device according to the present invention is not limited to the structure of the source signal line driver circuit of Embodiment 1, and that source signal line driver circuits with known structure can also be freely used.

[Embodiment 2]

An example of a structure of a gate signal line driver circuit of a display device according to the present invention is explained in Embodiment 2.

The gate signal line driver circuit is structured by a shift register, a scanning direction switching circuit, and the like. Note that, although not shown in the figure, circuits such as level shifters and buffers may also be suitably formed.

Signals such as a start pulse G_SP and a clock pulse G_CLK are input to the shift register, and a gate signal line selection signal is output.

Figure 16:
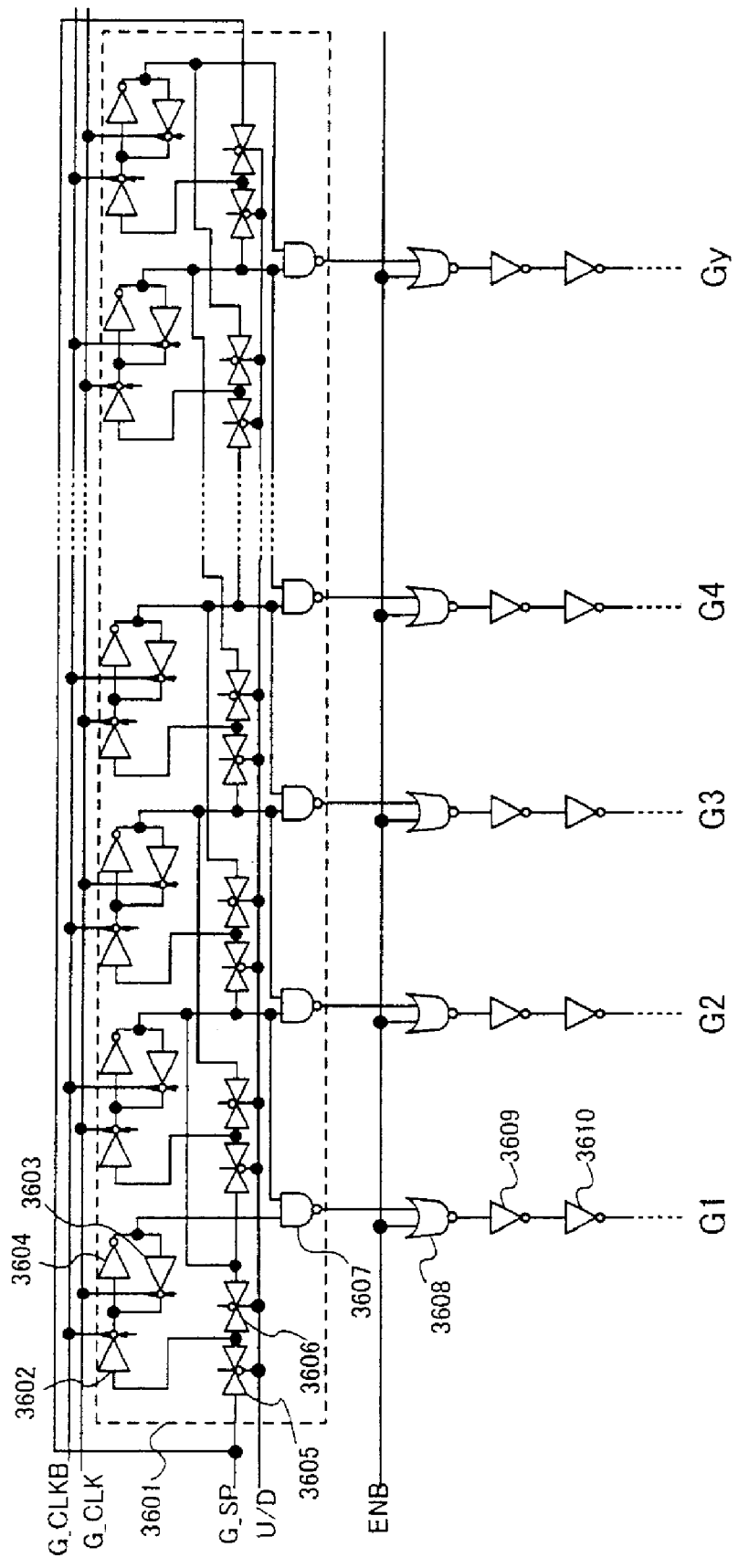
FIG. 16 is a diagram showing a structure of a gate signal line driver circuit of the display device of the present invention.

The structure of the gate signal line driver circuit is explained using FIG. 16.

A shift register 3601 is structured by clocked inverters 3602 and 3603, an inverter 3604, and a NAND 3607. The start pulse G_FSP is input to the shift register 3601. By changing the state of the clocked inverters 3602 and 3603 between a conductive state and a non-conductive state in accordance with a clock pulse G_CLK and an inverted clock pulse G_CLKB which has a inverse polarity to the clock pulse G_CLK, sampling pulses are output in order from the NAND 3607.

Further, the scanning direction switching circuit is structure by a switch 3605 and a switch 3606, and functions to switch the operation direction of the shift register between left and right directions. In FIG. 16, the shift register outputs sampling pulses in order from the left to the right in the case in which a left and right switching signal U/D corresponds to a Lo signal. On the other hand, if the left and right switching signal U/D is a Hi signal, then sampling pulses are output in order from the right to the.

The sampling pulses output from the shift register are input to a NOR 3608, and operation is performed with an enable signal ENB. This operation is performed in order to prevent a condition in which adjacent gate signal lines are selected at the same time due to dull sampling pulses. The signals output from the NOR 3608 are output to gate signal lines G1 to Gy, through buffers 3609 and 3610.

Note that, although not shown in the figure, level shifters and buffers may also be formed as appropriate.

Signals such as the start pulse G_SP and the clock pulse G_CLK input to the shift register are input from a display controller shown in the embodiment mode.

With the present invention, operations to reduce the frequency of the clock pulse G_CLK, the start pulse G_SP, and the like, input to the shift register of the gate signal line driver circuit, are performed by the display controller in the second display mode.

Sampling operations of the gate signal line driver circuit can therefore be reduced, and the electric power consumption of the display device can thus be curbed, in the second display mode.

Note that the gate signal line driver circuit of the display device according to the present invention is not limited to the structure of the gate signal line driver circuit of Embodiment 2. Gate signal line driver circuits with known structures can be freely used.

It is possible to freely combine Embodiment 2 with Embodiment 1.

[Embodiment 3]

In this embodiment, a method of sealing the display device of the present invention is described with reference to FIGS. 13A to 13C.

Figure 13A:
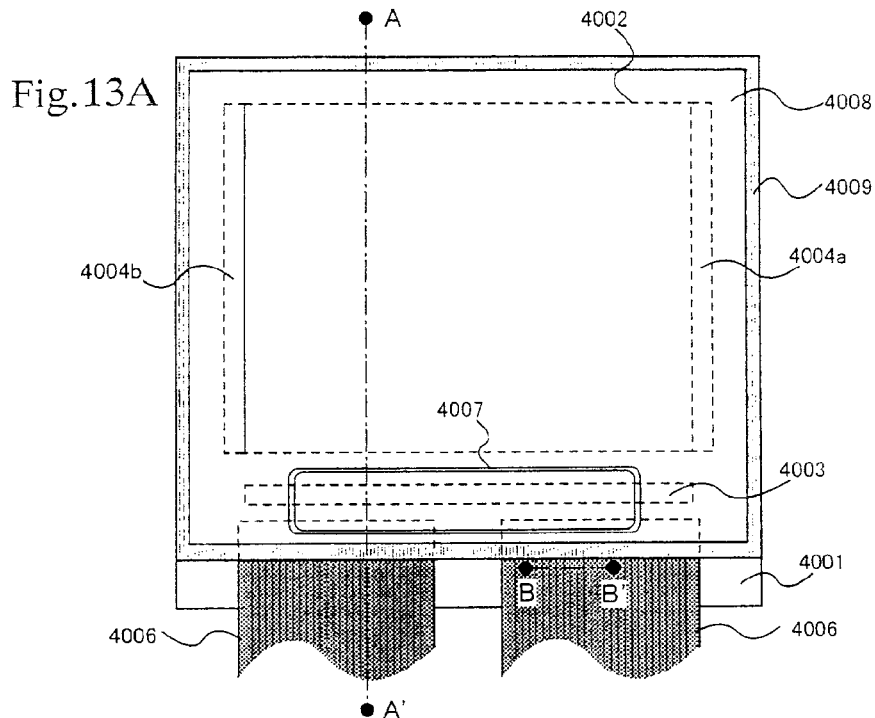
FIGS. 13A to 13C are diagrams showing a method of sealing a light emitting element of the display device of the present invention.
Figure 13B:
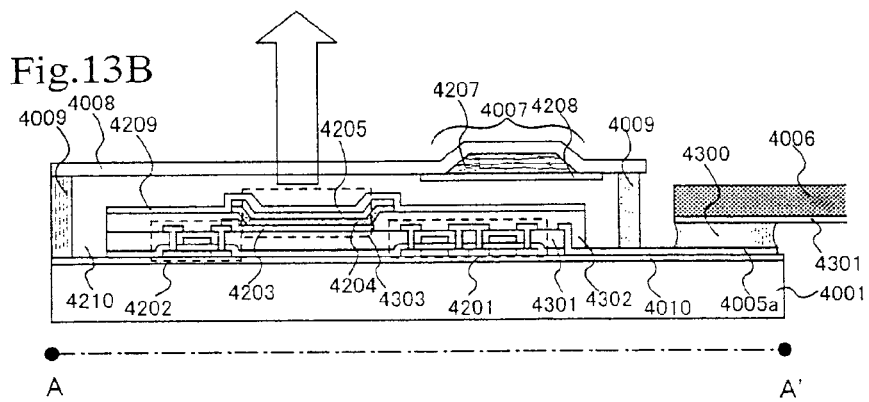
Figure 13C:
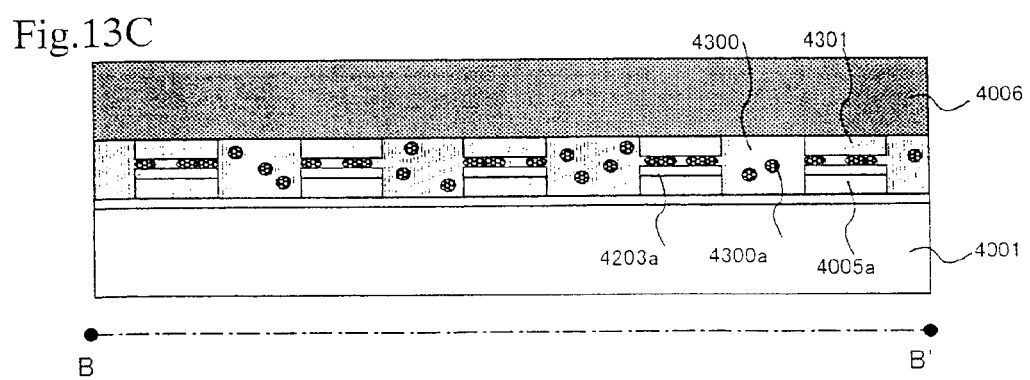

FIG. 13A is a top view of a display device, FIG. 13B is a sectional view taken along a line A-A' of FIG. 13A, and FIG. 13C is a sectional view taken along a line B-B' of FIG. 13A.

A seal member 4009 is provided so as to surround a pixel portion 4002, a source signal line driver circuit 4003, and first and second gate signal line driver circuits 4004a and 4004b, which are provided on a substrate 4001. Further, a sealing member 4008 is provided over the pixel portion 4002, the source signal line driver circuit 4003, and the first and the second gate signal line driver circuits 4004a and 4004b. Thus, the pixel portion 4002, the source signal line driver circuit 4003, and the first and the second gate signal line driver circuits 4004a and 4004b are sealed with a filler 4210 and by the substrate 4001, the seal member 4009, and the sealing member 4008.

Further, the pixel portion 4002, the source signal line driver circuit 4003, and the first and the second gate signal line driver circuits 4004a and 4004b provided on the substrate 4001 include a plurality of TFTs. FIG. 13B typically shows driving TFTs (here, an n-channel TFT and a p-channel TFT are shown) 4201 included in the source signal line driver circuit 4003 and a driving TFT 4202 included in the pixel portion 4002, which are formed on an under film 4010.

In Embodiment 3, the p-channel TFT or the n-channel TFT fabricated by a well-known method are used as the driving TFTs 4201, and a p-channel TFT fabricated by a well-known method is used as the driving TFT 4202. The storage capacitor (not illustrated) connected to the gate of the driving TFT 4202 is provided in the pixel portion 4002.

An interlayer insulating film (flattening film) 4301 is formed on the driving TFTs 4201 and the driving TFT 4202, and a pixel electrode (anode) 4203 electrically connected to a drain region of the driving TFT 4202 is formed thereon. A transparent conductive film having a high work function is used as the pixel electrode 4203. A compound of indium oxide and tin oxide, a compound of indium oxide and zinc oxide, zinc oxide, tin oxide, or indium oxide can be used for the transparent conductive film. Further, the transparent conductive film added with gallium may be used.

An insulating film 4302 is formed on the pixel electrode 4203, and an opening portion is formed in the insulating film 4302 over the pixel electrode 4203. In this opening portion, an organic compound layer 4204 is formed on the pixel electrode 4203. A well-known organic material or inorganic material can be used for the organic compound 4204. Although the organic material includes a low molecular system (monomer system) and a high molecular system (polymer system), either may be used.

As a formation method of the organic compound layer 4204, a well-known evaporation technique or coating technique may be used. The structure of the organic compound layer may be a laminate structure obtained by freely combining a hole injection layer, a hole transfer layer, a light emitting layer, an electron transfer layer, or an electron injection layer, or a single layer structure.

A cathode 4205 made of a conductive film (typically, a conductive film containing aluminum, copper or silver as its main ingredient, or a laminate film of those and another conductive films) having a light shielding property is formed on the organic compound layer 4204. It is desirable that moisture and oxygen existing on the interface between the cathode 4205 and the organic compound layer 4204 are removed to the utmost. Accordingly, it is necessary to make such contrivance that the organic compound layer 4204 is formed in a nitrogen or rare gas atmosphere, and the cathode 4205 is formed while the organic compound layer is not exposed to oxygen or moisture. In this embodiment, a multi-chamber system (cluster tool system) film forming apparatus is used, so that the film formation as described above is enabled. A predetermined voltage is applied to the cathode 4205.

In the manner as described above, a light emitting element 4303 constituted by the pixel electrode (anode) 4203, the organic compound layer 4204, and the cathode 4205 is formed. Then, a protection film 4209 is formed on the insulating film 4302 so as to cover the light emitting element 4303. The protection film 4209 is effective to prevent oxygen, moisture and the like from penetrating into the light emitting element 4303.

Reference numeral 4005a designates a drawing wiring line connected to a power supply line and is electrically connected to a source region of the driving TFT 4202. The drawing wiring line 4005a passes between the seal member 4009 and the substrate 4001, and is electrically connected to an FPC wiring line 4301 included in an FPC 4006 through an anisotropic conductive film 4300.

As the sealing member 4008, a glass member, a metal member (typically, a stainless member), a ceramic member, or a plastic member (including a plastic film) can be used. As the plastic member, an FRP (Fiberglass-Reinforced Plastics) plate, a PVF (polyvinyl fluoride) film, a Mylar film, a polyester film or an acryl resin film can be used. Further, a sheet having such a structure that an aluminum foil is interposed between PVF films or Mylar films can also be used.

However, in the case where the radiation direction of light from the light emitting element is directed toward the side of a cover member, the cover member must be transparent. In this case, a transparent material such as a glass plate, a plastic plate, a polyester film, or an acryl film is used.

As the filler 4103, in addition to an inert gas such as nitrogen or argon, ultraviolet ray curing resin or thermosetting resin can be used, and PVC (polyvinyl chloride), acryl, polyimide, epoxy resin, silicone resin, PVB (polyvinyl butyral), or EVA (ethylene-vinyl acetate) can be used. In this embodiment, nitrogen was used as the filler.

Further, in order to expose the filler 4210 to a hygroscopic material (preferably, barium oxide) or a material capable of adsorbing oxygen, a recess portion 4007 is provided on the surface of the sealing member 4008 at the side of the substrate 4001 and the hygroscopic material or the material 4207 capable of adsorbing oxygen is disposed. Then, in order to prevent the hygroscopic material or the material 4207 capable of adsorbing oxygen from scattering, the hygroscopic material or the material capable of adsorbing oxygen are held in the recess portion 4007 by a recess cover member 4208. Note that, the recess cover member 4208 is formed into a fine mesh, and has such a structure that air or moisture is permeated and the hygroscopic material or the material 4207 capable of adsorbing oxygen is not permeated. The deterioration of the light emitting element 4303 can be suppressed by providing therewith the hygroscopic material or the material 4207 capable of adsorbing oxygen.

As shown in FIG. 13C, at the same time as the formation of the pixel electrode 4203, a conductive film 4203a is formed to be in contact with the drawing wiring line 4005a.

The anisotropic conductive film 4300 includes a conductive filler 4300a. The substrate 4001 and the FPC 4006 are thermally compressed, so that the conductive film 4203a on the substrate 4001 and the FPC wiring line 4301 on the FPC 4006 are electrically connected through the conductive filler 4300a.

It is possible to freely combine Embodiments 1 and 2 with Embodiment 3.

[Embodiment 4]

This embodiment describes electronic equipment of the present invention with reference to FIGS. 14A to 14F.

FIG. 14A is a schematic diagram of a portable information terminal according to the present invention. The portable information terminal is composed of a main body 2701a, operation switches 2701b, a power switch 2701c, an antenna 2701d, a display unit 2701e, and an external input port 2701f. A display device having the structure shown in Embodiment Modes and Embodiments 1 through 3 is used in the display unit 2701e.

FIG. 14B is a schematic diagram of a personal computer according to the present invention. The personal computer is composed of a main body 2702a, a case 2702b, a display unit 2702c, operation switches 2702d, a power switch 2702e, and an external input port 2702f. A display device having the structure shown in Embodiment Modes and Embodiments 1 through 3 is used in the display unit 2702c.

FIG. 14C is a schematic diagram of an image reproducing device according to the present invention. The image reproducing device is composed of a main body 2703a, a case 2703b, a recording medium 2703c, a display unit 2703d, an audio output unit 2703e, and operation switches 2703f. A display device having the structure shown in Embodiment Modes and Embodiments 1 through 3 is used in the display unit 2703d.

FIG. 14D is a schematic diagram of a television according to the present invention. The television is composed of a main body 2704a, a case 2704b, a display unit 2704c, and operation switches 2704d. A display device having the structure shown in Embodiment Modes and Embodiments 1 through 3 is used in the display unit 2704c.

FIG. 14E is a schematic diagram of a head mounted display according to the present invention. The head mounted display is composed of a main body 2705a, a monitor unit 2705b, a headband 2705c, a display unit 2705d, and an optical system 2705e. A display device having the structure shown in Embodiment Modes and Embodiments 1 through 3 is used in the display unit 2705d.

FIG. 14F is a schematic diagram of a video camera according to the present invention. The video camera is composed of a main body 2706a, a case 2706b, a connection unit 2706c, an image receiving unit 2706d, an eye piece unit 2706e, a battery 2706f, an audio input unit 2706g, and a display unit 2706h. A display device having the structure shown in Embodiment Modes and Embodiments 1 through 3 is used in the display unit 2706h.

Not limited to the above-mentioned electronic equipments, the present invention can be applied to various electronic equipments.

The electric power consumption of a display device can be reduced with the aforementioned structures of the present invention. In addition, it becomes possible to lengthen the display period in one frame period, even in the case in which the number of sub-frame periods used for expressing gray scales is reduced. Thus, it becomes possible to provide a display device which is capable of clear image display, and to provide a method of driving the display device.

Furthermore, the display period for a light emitting element per one frame period can be increased, and therefore the voltage applied between an anode and a cathode of the light emitting element can be set lower in the case of expressing the same brightness per frame. It thus becomes possible to provide a display device with high reliability.

It is also possible to apply the present invention to self-light emitting type display devices using FDPs, PDPs, and the like, not only to display devices using OLED elements.

What is claimed is:

1. A display device comprising:
    a display comprising:
        a pixel portion; and
        a signal line driver circuit electrically connected to the pixel portion;
    a display controller comprising:
        a first clock generator circuit for generating a first clock signal;
        a second clock generator circuit for supplying a second clock signal to the signal line driver circuit; and
        a first variable frequency divider circuit for changing a frequency of the first clock signal among at least two display modes, according to a gray scale control signal, and for supplying the changed first clock signal to the second clock generator circuit; and
    a signal control circuit comprising:
        a first memory electrically connected to the signal line driver circuit;
        a second memory electrically connected to the signal line driver circuit; and
        a memory controller comprising:
            a decoder for selecting an address of the first memory and the second memory;
            an oscillator circuit for generating a selecting signal; and
            a second variable frequency divider circuit for changing a frequency of the selecting signal according to at least two display modes, and for supplying the changed selecting signal to the decoder, wherein the memory controller is configured to control reading out from the first memory while simultaneously writing in the second memory.

2. An electronic apparatus comprising the display device according to claim 1, wherein the electronic apparatus is one selected from the group consisting of a portable information terminal, a personal computer, an image reproducing device, a television, a head mounted display, and a video camera.

3. A display device according to claim 1, wherein a first display mode has n sub-frame periods in one frame period and a second display mode has m sub-frame periods in one frame period, where m and n are natural numbers, and m is less than n, wherein the memory controller is configured to read out n bits during the first display mode, wherein the memory controller is configured to read out m bits during the second display mode, and wherein the memory controller is configured to eliminate reading out n-m bits during the second display mode.

4. A display device comprising:

a display comprising:
  a pixel portion;
  a source signal line driver circuit electrically connected to the pixel portion; and
  a gate signal line driver circuit electrically connected to the pixel portion;

a display controller comprising:
  a horizontal clock generator circuit for supplying a source clock signal to the source signal line driver circuit;
  a vertical clock generator circuit for supplying a gate clock signal to the gate signal line driver circuit;
  a clock generator circuit for generating a clock signal; and
  a first variable frequency divider circuit for changing a frequency of the clock signal among at least two display modes, according to a gray scale control signal, and for supplying the changed clock signal to the horizontal clock generator circuit and to the vertical clock generator circuit; and a signal control circuit comprising:
  a first memory electrically connected to the source signal line driver circuit;
  a second memory electrically connected to the source signal line driver circuit; and
  a memory controller comprising:
    a memory R/W circuit for controlling writing a video signal in the first memory and the second memory and for reading the video signal from the first memory and the second memory;
    gray scale limiter circuit for supplying a control signal to the memory R/W circuit according to at least two display modes;
    a decoder for selecting an address of the first memory and the second memory;
    an oscillator circuit for generating a selecting signal; and
    a second variable frequency divider circuit for changing a frequency of the selecting signal according to the at least two display modes, and for supplying the changed selecting signal to the decoder, wherein the memory controller is configured to control reading out from the first memory while simultaneously writing in the second memory.

5. A display device according to claim 4, wherein the video signal is a digital video signal.

6. A display device according to claim 4, wherein the pixel portion includes a pixel comprising an organic light emitting diode element.

7. A display device according to claim 6, wherein the display controller further comprises an electric power source for controlling a potential of an opposing electrode of the organic light emitting diode element, according to the gray scale control signal.

8. An electronic apparatus comprising the display device according to claim 4, wherein the electronic apparatus is one selected from the group consisting of a portable information terminal, a personal computer, an image reproducing device, a television, a head mounted display, and a video camera.

9. A display device according to claim 4, wherein a first display mode has n sub-frame periods in one frame period and a second display mode has m sub-frame periods in one frame period, where m and n are natural numbers, and m is less than n, wherein the memory controller is configured to read out n bits during the first display mode, wherein the memory controller is configured to read out m bits during the second display mode, and wherein the memory controller is configured to eliminate reading out n-m bits during the second display mode.

10. A display device according to claim 4, wherein the first memory is capable of storing signals of all pixels included in the pixel portion of one screen, and wherein the second memory is capable of storing signals of all pixels included in the pixel portion of one screen.

11. A display device according to claim 4, wherein the source signal line driver circuit comprises a scanning direction switching circuit.

12. A display device according to claim 4, wherein the gate signal line driver circuit comprises a scanning direction switching circuit.

13. A display device according to claim 4, wherein the pixel portion comprises a first a plurality of pixels, and wherein each of the pixels comprises a transistor and a storage capacitor electrically connected to the transistor.

14. A display device according to claim 4, wherein the pixel portion comprises a pixel comprising an organic light emitting diode element, and wherein the organic light emitting diode element is electrically connected to a transparent conductive film including gallium.

15. A display device comprising:

a display comprising:
  a pixel portion; and
  a signal line driver circuit electrically connected to the pixel portion;

a display controller comprising:
  a first clock generator circuit for generating a first clock signal;
  a second clock generator circuit for supplying a second clock signal to the signal line driver circuit; and
  a first variable frequency divider circuit for changing a frequency of the first clock signal among at least two display modes, according to a gray scale control signal, and for supplying the changed first clock signal to the second clock generator circuit; and a signal control circuit comprising:
  a first memory electrically connected to the signal line driver circuit;

a second memory electrically connected to the signal line driver circuit; and a memory controller comprising:

a decoder for selecting an address of the first memory and the second memory;

an oscillator circuit for generating a selecting signal; and a second variable frequency divider circuit for changing a frequency of the selecting signal according to at least two display modes, and for supplying the changed selecting signal to the decoder, wherein the memory controller is configured to control reading out from the first memory while simultaneously writing in the second memory, and wherein the pixel portion includes a pixel comprising an organic light emitting diode element.

16. A display device according to claim 15, wherein the display controller controls a potential of an opposing electrode of the organic light emitting diode element, according to the gray scale control signal.

17. An electronic apparatus comprising the display device according to claim 15, wherein the electronic apparatus is one selected from the group consisting of a portable information terminal, a personal computer, an image reproducing device, a television, a head mounted display, and a video camera.

18. A display device according to claim 15, wherein a first display mode has n sub-frame periods in one frame period and a second display mode has m sub-frame periods in one frame period, where m and n are natural numbers, and m is less than n, wherein the memory controller is configured to read out n bits during the first display mode, wherein the memory controller is configured to read out m bits during the second display mode, and wherein the memory controller is configured to eliminate reading out n-m bits during the second display mode.

* * * * *